(12) United States Patent
Nakamura et al.

(10) Patent No.: US 6,914,765 B2
(45) Date of Patent: Jul. 5, 2005

(54) RELAY, RELAY UNIT AND ELECTRICAL JUNCTION BOX

(75) Inventors: Tsuyoshi Nakamura, Kosai (JP); Hiroyo Matsumura, Kosai (JP); Yoshifumi Iwata, Kosai (JP)

(73) Assignee: Yazaki Corporation, Tokyo (JP)

( * ) Notice: Subject to any disclaimer, the term of this patent is extended or adjusted under 35 U.S.C. 154(b) by 114 days.

(21) Appl. No.: 10/025,491

(22) Filed: Dec. 26, 2001

(65) Prior Publication Data

US 2002/0080562 A1 Jun. 27, 2002

(30) Foreign Application Priority Data

Dec. 27, 2000 (JP) ..................................... P2000-39951
Apr. 16, 2001 (JP) ..................................... P2001-117030
Nov. 12, 2001 (JP) ..................................... P2001-346681

(51) Int. Cl.[7] ............................................. H01H 47/00
(52) U.S. Cl. ...................... 361/160; 361/166; 361/760
(58) Field of Search ................................. 361/160, 161, 361/166, 170, 104, 58, 760, 772, 777, 152

(56) References Cited

U.S. PATENT DOCUMENTS

| | | | |
|---|---|---|---|
| 3,889,216 A | | 6/1975 | Hammell ..................... 335/106 |
| 4,221,455 A | * | 9/1980 | Cairns et al. ................ 439/355 |
| 5,038,050 A | * | 8/1991 | Minoura ..................... 307/10.1 |
| 5,731,944 A | * | 3/1998 | Yasukuni et al. ........... 361/104 |
| 5,763,827 A | * | 6/1998 | Sugiura ........................ 174/49 |

FOREIGN PATENT DOCUMENTS

| | | |
|---|---|---|
| DE | 31 28 502 A1 | 2/1983 |
| DE | 3209915 A1 | 9/1983 |
| DE | 29720249 U1 | 1/1998 |
| DE | 10008366 A1 | 9/2000 |
| GB | 2 349 991 A | 11/2000 |
| JP | 06-086244 | 12/1994 |

* cited by examiner

Primary Examiner—Stephen W. Jackson
(74) Attorney, Agent, or Firm—Finnegan, Henderson, Farabow, Garrett & Dunner, L.L.P.

(57) ABSTRACT

A relay, a relay unit and an electrical junction box are disclosed as including a plurality of relays (2A~2D), each of which includes a pair of switch connector circuit components (5a~5d, 6a~6d) between which a relay switch (SW) is intervened, a pair of coil connector circuit components (7a~7d, 8a~8d) between which a relay coil (L) is intervened, and a plurality of electrically conductive trimmer joint portions (9a~9j) joined between the respective switch connector circuit components (5a~5d, 6a~6d) and the respective coil connector circuit components (7a~7d, 8a~8d) and able to be cut out at suitable cutting points to provide a desired mounting circuit profiled in a selected relay circuit pattern.

5 Claims, 16 Drawing Sheets

RELAY, RELAY UNIT AND ELECTRICAL JUNCTION BOX

BACKGROUND OF THE INVENTION

The present invention relates to a relay unit having a plurality of relays, and a relay to be applied to such a relay unit, and an electrical junction box in which such a relay unit is mounted.

A relay box, which serves as an electrical junction box which an attempt has heretofore been made to be improved, is disclosed in FIG. 1.

In FIG. 1, the relay box 120 is comprised of a relay cavity 121, a fuse cavity 122, a FL cavity 123 and a bus bar 124, with respective cavities 121, 122, 123 receiving electronic component parts such as a relay, a fuse and a FL. The bus bar 124 provides an electrical connection for the respective cavities 121, 122, 123. Further, the respective cavities 121, 122, 123 are inserted with pressure connection terminals, each coupled to an electric wiring through a pressure connection, through which desired electric signals are inputted or outputted. With such a structure, the relay box 120 is formed with a desired relay circuit.

By the way, the relay circuit is not common to whole vehicles, and the vehicle requires relay circuits with specifications different from one another in accordance with a particular specification needed by the vehicle. However, the relay box 120 has no function to enable circuit modifications or circuit alterations and has a function to comply with a single relay circuit, with a resultant troublesome preparation needed for large number of relay boxes 120 specified for particular relay circuits complying with respective vehicle's specifications.

SUMMARY OF THE INVENTION

The present invention has been made with a view to addressing the above issues and has an object to provide a relay unit which has a capability of complying with variations in mounting circuits satisfying various specifications of vehicles, and a relay and an electrical junction box which can be applied to such a relay unit.

According to a first aspect of the present invention, there is provided a relay unit comprising: a plurality of relays located in a given pattern and each including a pair of first and second switch connector circuit components between which a relay switch element is intervened and a pair of first and second coil connector circuit components between which a relay coil element is intervened; and a plurality of electrically conductive trimmer joint portions preliminarily interconnecting said switch connector circuit components and said coil connector circuit components to one another; wherein said plurality of electrically conductive trimmer joint portions can be selectively cut out to provide a desired mounting circuit formed in a selected relay circuit pattern.

With such a relay unit, the presence of the electrically conductive trimmer joint portions formed in the first and second switch joint circuit components and the first and second coil joint circuit components enables various relay circuit patterns to be formed according to the cut out points of the plurality of trimmer joint portions. Further, when it is desired to leave both the joint circuit components in a jointed state, a particular joint portion between both the joint circuit components remains uncut.

According to a second aspect of the present invention, there is provided an electrical junction box comprising: a relay unit including a plurality of relays each including a pair of first and second switch connector circuit components between which a relay switch element is intervened and a pair of first and second coil connector circuit components between which a relay coil element is intervened, and a plurality of electrically conductive trimmer joint portions interconnecting said first and second switch connector circuit components and said first and second coil connector circuit components to one another, wherein said plurality of electrically conductive trimmer joint portions can be cut out to provide a desired mounting circuit formed in a selected relay circuit pattern.

With such a structure, the presence of the relay unit composed of the plurality of relays each including the first and second switch joint circuit components and the first and second coil circuit components which are jointed together by means of the plurality of electrically conductive trimmer joint portions allows the plural trimmer joint portions to be selectively cut out in an easy manner at an extremely low cost to provide a variety of relay circuit patterns to comply with various specifications of vehicles to which the electrical junction boxes are applied.

According to a third aspect of the present invention, there is provided a relay comprising: a pair of switch connector circuit components between which a relay switch element is intervened; a pair of coil connector circuit components between which a relay coil element is intervened; and a fuse connector portion unitarily coupled with a fuse into a unitary structure to allow power supply current to be supplied to said switch connector circuit components and said coil connector components.

With such a structure, since the fuse is directly coupled to the fuse connector portion, there is no need for electrical connection using a discrete electrical wiring between the relay and the fuse, resulting in an improved workability. Further, since the fuse is located in a stacked state with respect to the relay, a receiving space for the fuse connector portion and the fuse is formed in a compact profile to enable a miniaturization of the electrical junction box.

According to a fourth aspect of the present invention, there is provided an electrical junction box comprising: a relay including a pair of switch connector circuit components between which a relay switch element is intervened and a pair of coil connector circuit components between which a relay coil element is intervened; wherein said relay is unitarily coupled with a fuse via a fuse connector portion to provide a unitary structure; and wherein said relay is received in said electrical junction box such that the relay is laid in a minimum projected area in a direction perpendicular to a mounting surface of said electrical junction box.

With such a structure, since the relay is received in the electrical junction box such that the projected area of the relay to be mounted has a minimum value when the relay is mounted in the electrical junction box in a vertical state. This results in a decreased mounting area in the electrical junction box, with a resultant miniaturization of the electrical junction box.

Other aspect and advantages of the invention will become more apparent from the following description, taken in conjunction with the accompanying drawings, illustrating by way of example the principles of the invention.

BRIEF DESCRIPTION OF THE DRAWINGS

FIG. 4 is a view illustrating circuit diagrams of object circuitries No. 1 to 4 which are formed by cutting the trimmer joint portions of the basic bus bar circuit components and associated bus bar trimming and conducting patterns;

FIG. 6 is a view illustrating circuit diagrams of object circuitries No. 7 and 8 which are formed by cutting the trimmer joint portions of the basic bus bar circuit components and associated bus bar trimming and conducting patterns;

DETAILED DESCRIPTION OF THE PREFERRED EMBODIMENTS

Figure 1:
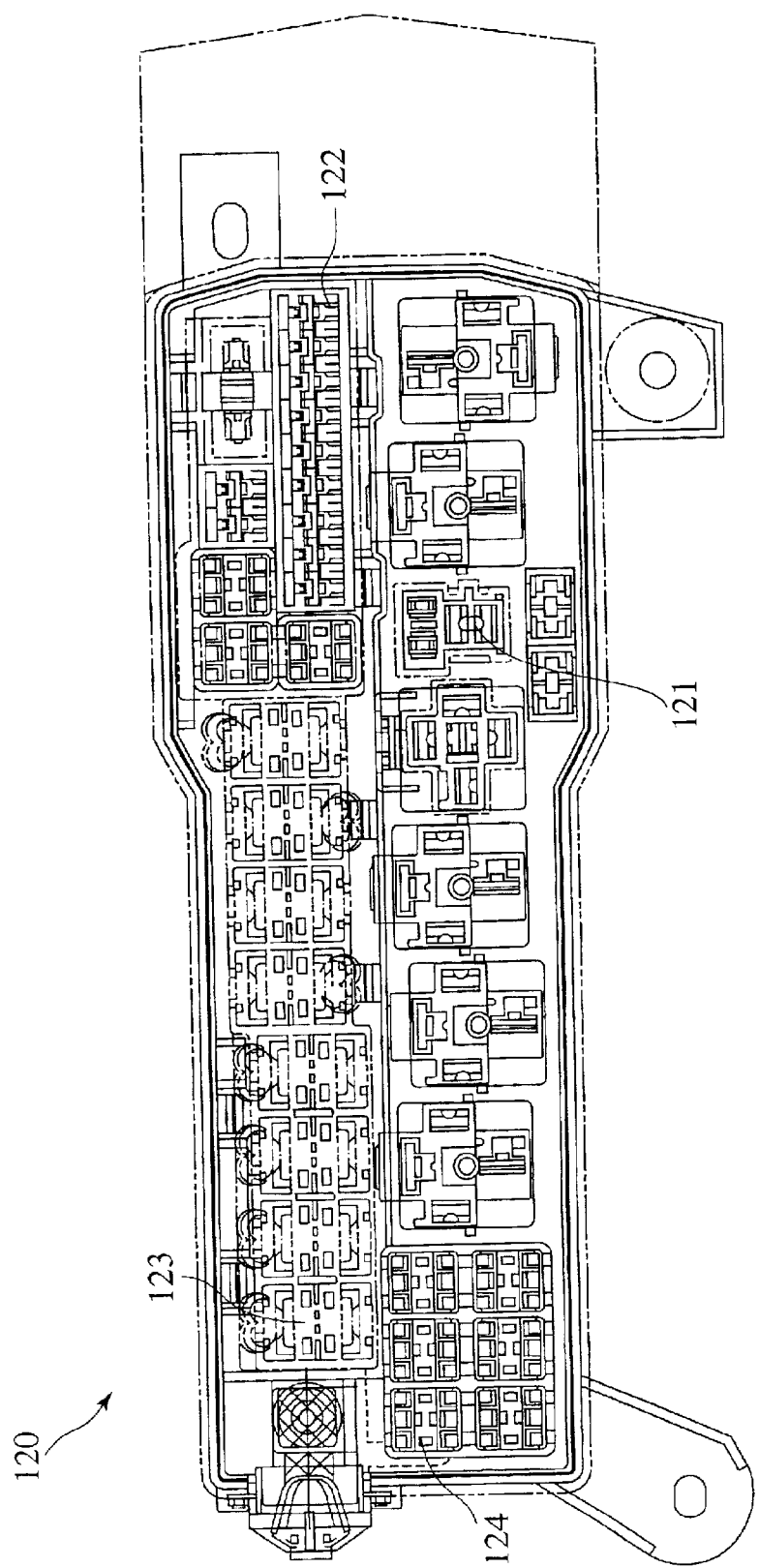
FIG. 1 is a plan view of a relay box which an attempt has been made to be improved by inventors of the present patent application.
Figure 2:
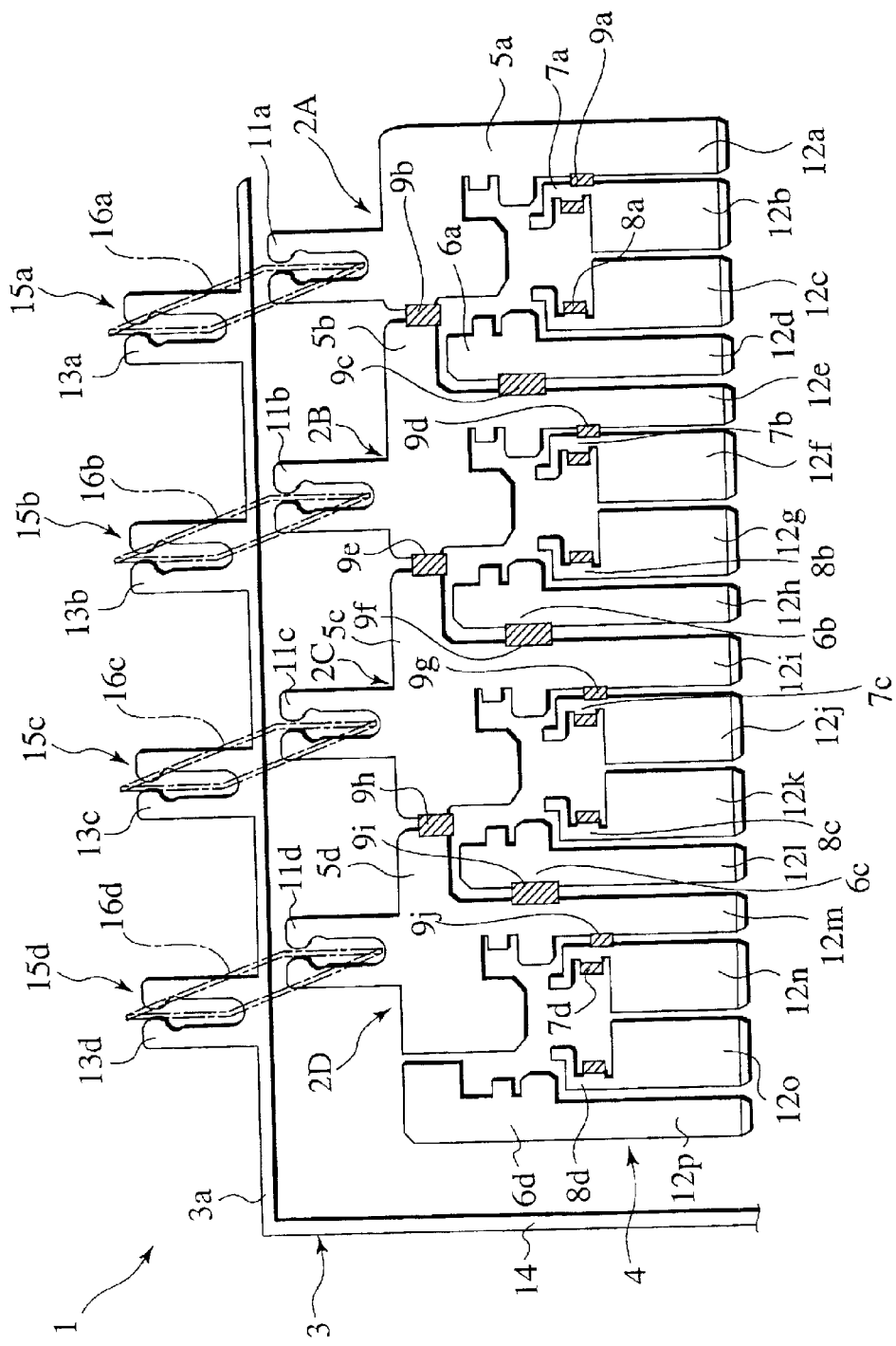
FIG. 2 is a structural view illustrating a relay unit of a first preferred embodiment of the present invention wherein basic bus bar circuit components and a power supply bus bar component are involved.
Figure 3:
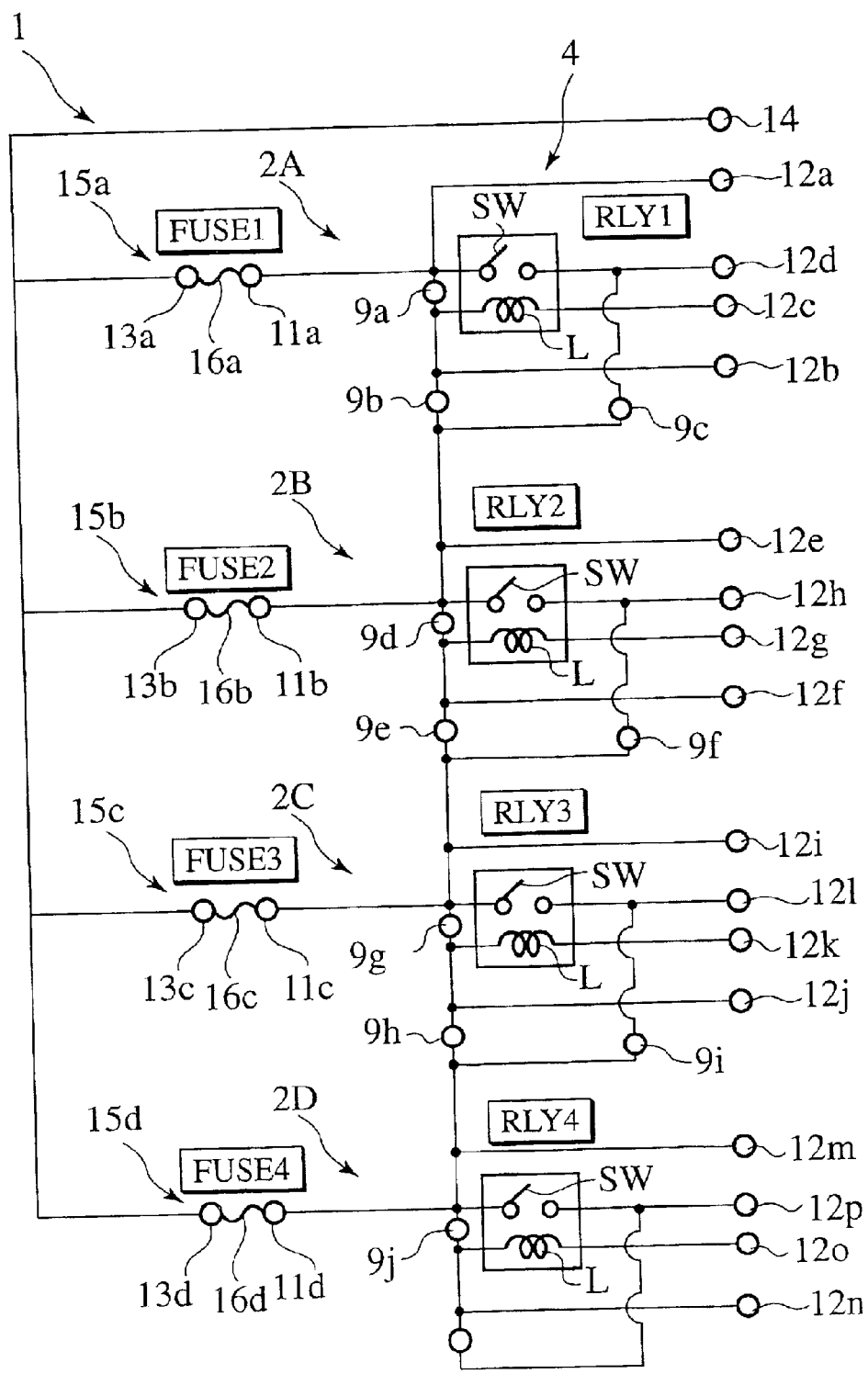
FIG. 3 is a circuit diagram of the relay unit shown in FIG. 1 under a condition prior to cutting out operation of trimmer joint portions between the basic bus bar circuit components.

To describe the present invention more in detail, a relay unit of a first preferred embodiment of the present invention will be explained below with reference to FIGS. 2 to 9, wherein FIG. 2 is a structural view illustrating a basic bus bar circuit body 4 and a power supply bus bar 3 which form a relay unit 1 of the first preferred embodiment, FIG. 3 is a circuit diagram of the relay unit 1 with a plurality of electrically conductive trimmer joint portions 9a to 9j, formed in the basic bus bar circuit body 4, shown in a state prior to trimming operation.

As shown in FIGS. 2 and 3, the relay unit 1 is comprised of four sets of laterally arrayed relays 2A to 2D which is located in a unit case (not shown) in close proximity relationship to one another in the same horizontal plane, and the power supply bus bar 3 located in an area adjacent to the laterally arrayed relays 2A to 2D. The four sets of relays 2A to 2D include four relay switch element elements SW (see FIG. 3), relay coil elements L (see FIG. 3) associated with respective relay switches SW, and the basic bus bar circuit body 4.

The basic bus bar circuit body 4 is composed of laterally spaced, switch connector bus bars 5a to 5d and laterally spaced, switch connector bus bars 6a to 6d placed in close proximity to the switch connector bus bars 5a to 5d, respectively, to be correlated therewith for forming respective pairs of switch connector circuit components each for the relay switch element SW, and laterally spaced, coil connector bus bars 7a to 7d and laterally spaced, coil connector bus bars 8a to 8d placed in close proximity to the switch connector bus bars 7a to 7d, respectively, to be correlated therewith for forming respective pairs of coil connector circuit components each for the coil element L, with four pairs of switch connector circuit components being located in parallel to one another which the four pairs of coil connector circuit components are enclosed in the associated switch connector circuit components. The basic bus bar circuit body 4 is further composed of the electrically conductive trimmer joint portions 9a to 9j which are integrally and preliminarily formed at suitable positions between the respective switch connector bus bars 5a to 5d, and 6a to 6d and the respective coil connector bus bars 7a to 7d and 8a to 8d. Thus, the basic bus bar circuit body 4 is made of an electrically conductive material formed with a bus bar forming die of a single piece, with each of the respective joint portions 9a to 9j being formed in a narrow width to provide an ease of cutting operation to thereby provide a trimming function.

In particular, the joint portions 9a to 9j are intervened between one of the switch connector bus bars 5a to 5d and the other one of the coil connector bus bars 7a to 7d within the same one of the relays 2A to 2D and intervened between each of the switch connector bus bar pairs 5a to 5d and 6a to 6d and the other one of the switch connector bus bars 5a to 5d. Suitably cutting a suitable part of the plurality of electrically conductive trimmer joint portions 9a to 9j allows a variety of selected relay circuit patterns to be readily formed as will be described below in detail. In FIG. 3, to provide a clarification, the basic bus bar circuit body 4 is formed with the joint portions, bearing the same reference numerals as those used in FIG. 2, which can be cut out for the trimming function by the cutting step.

The switch connector bus bars 5a to 5d, of one part of the relays 2A to 2D, have upper ends integrally formed with downstream fuse joint portions 11a to 11d, respectively, to be connected with respective fuses, and lower ends integrally formed with connector joint relay terminals 12a, 12e, 12i and 12m, respectively, to be connected with respective connectors. The downstream fuse joint portions 11a to 11d protrude in respective fuse mounting areas (not shown) of the unit case (not shown), and the relay terminals 12a, 12e, 12i and 12m protrude into respective connector hood areas (not shown) of the unit case (not shown). That is, the downstream fuse joint portions 11a to 11d and the relay terminals 12a, 12e, 12i and 12m protrude in directions opposed to one another.

The switch connector bus bars 6a to 6d and both the coil connector bus bars 7a to 7d and 8a of the other part of the relays 2A to 2D, have lower ends integrally formed with connector joint relay terminals 12b to 12d, 12f to 12h, 12j to 12l and 12n to 12p, respectively, to be connected with relevant connectors. The respective relay terminals 12b to 12d, 12f to 12h, 12j to 12l and 12n to 12p protrude into the respective connector hood areas (not shown) of the unit case (not shown) in the same manner as the switch connector bus bars 12a, 12e, 12j and 12m of the aforementioned one part of the relays. That is, all the relay terminals 12a to 12p are formed in parallel to one another in the lower connector hood area (not shown) in which the relevant connectors are mounted to provide electrical connections between the relay terminals and outside associated component parts.

The power supply bus bar 3 is constructed of a laterally extending main bar 3a in the close proximity to upper distal edges of downstream fuse joint portions 11a to 11d of the relays 2A to 2D, four upstream fuse joint portions 13a to 13d which project upward from the main bar 3a, and a power supply terminal 14 bent downward from a left distal end of the main bar 3a. The main bar 3a is located on an inner surface in the unit case (not shown), with the four upstream fuse joint portions 13a to 13d being located in four fuse mounting areas (not shown) in the unit case (not shown), respectively. The four upstream fuse joint portions 13a to 13d are aligned on respective positions opposed to the downstream fuse joint portions 11a to 11d, respectively, with the upstream fuse joint portions 13a to 13d and the downstream fuse joint portions 11a to 11d forming the sum of four sets of fuse joint section pairs 15a to 15d. In addition, the respective upstream fuse joint portions 13a to 13d and the respective downstream fuse joint portions 11a to 11d are formed with cutout portions which extend from respective upper edges in a downward direction. Inserting fuses 16a to 16d into the respective cutout portions of the fuse joint section pairs 15a to 15d allows them to be fixedly mounted therein.

The power supply terminal 14 is formed such that it protrudes into a power supply hood area (not shown) of the unit case (not shown) and is electrically connected to an associated external component part via a connector (not shown) mounted in a connector hood area (not shown). Thus, the relay unit 1 has the structure to allow electric power to be supplied from the power supply bus 3 to the four relays 2A to 2D via the respective fuses 16a to 16d.

Figure 4:
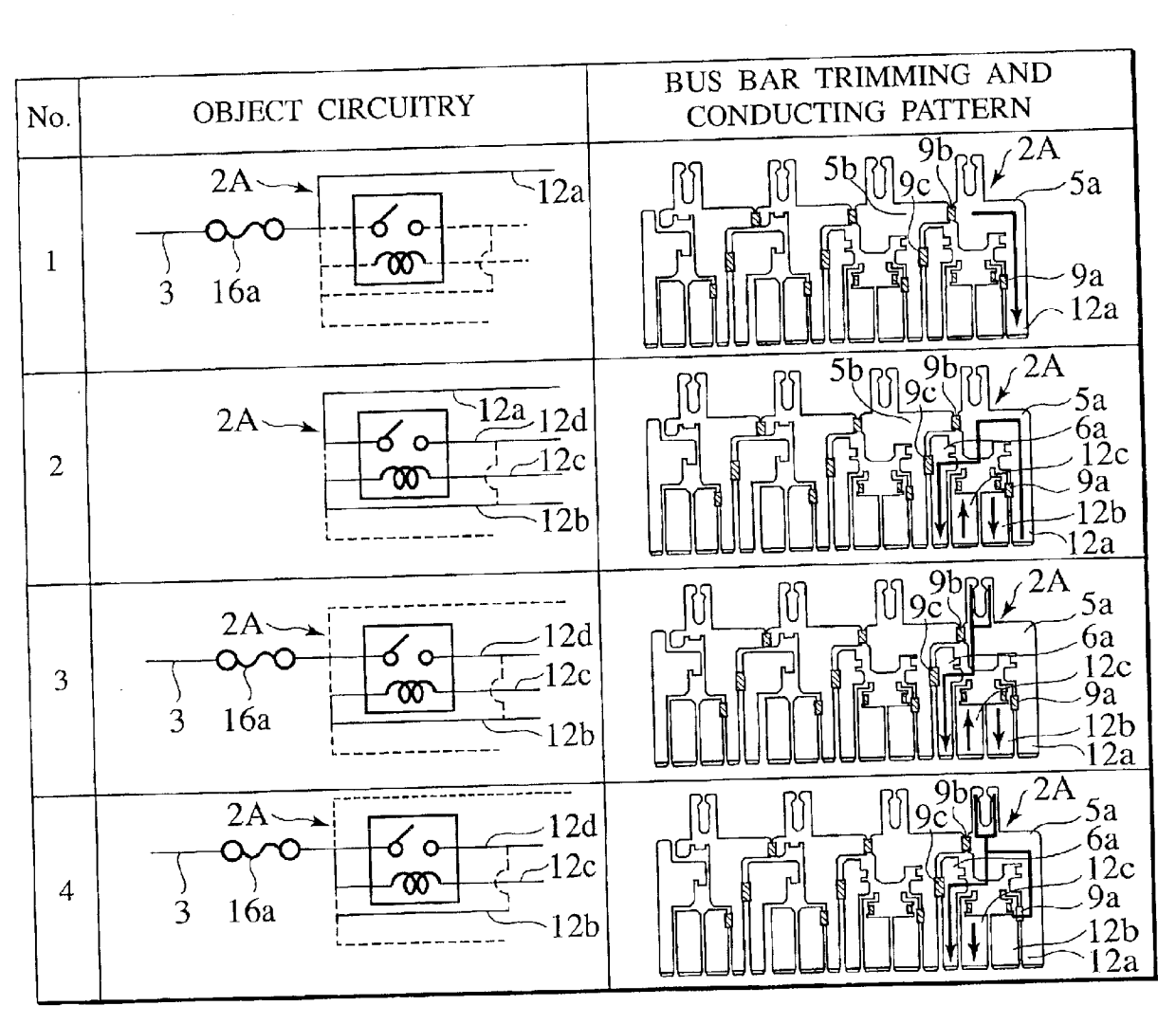
Figure 5:
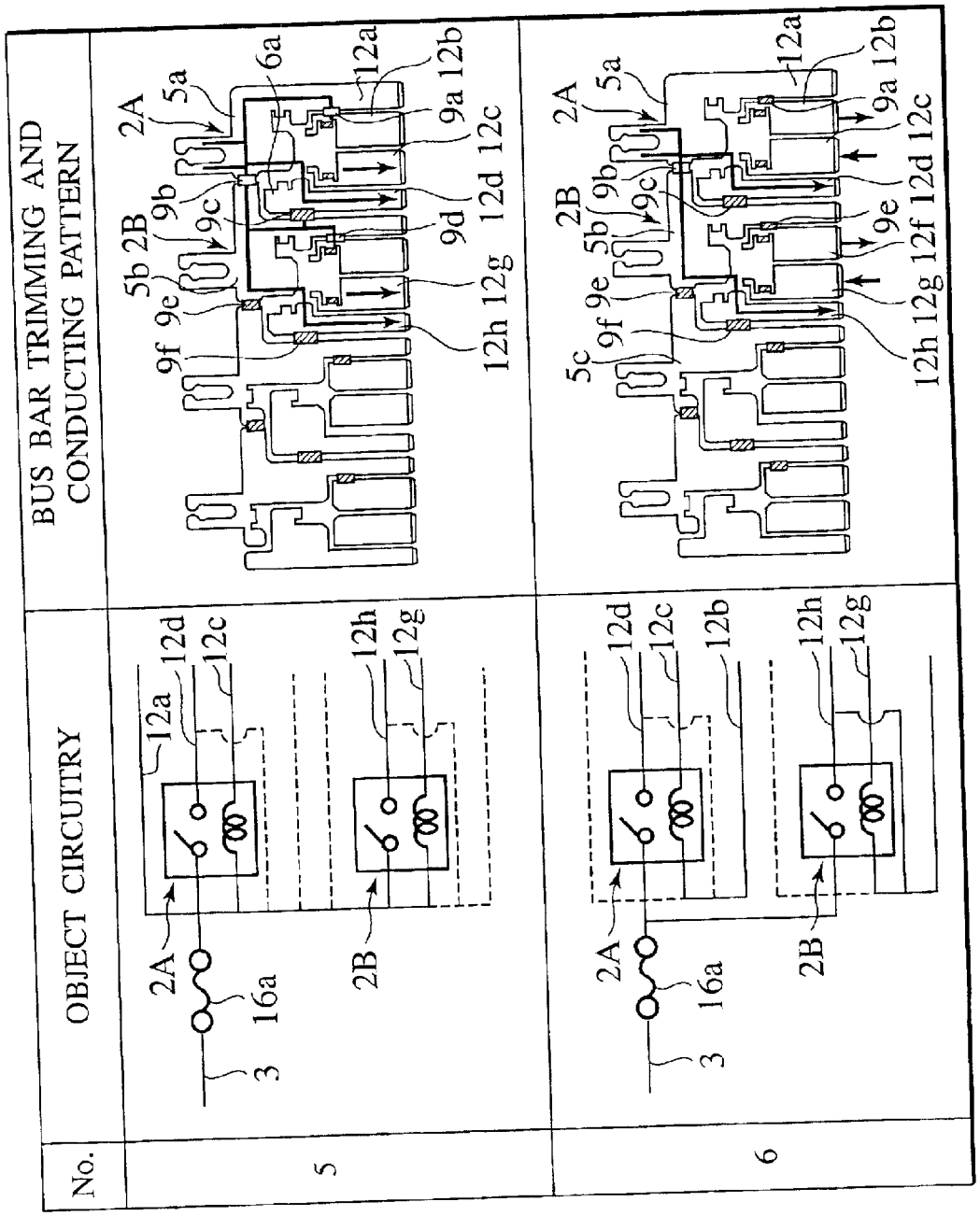
FIG. 5 is a view illustrating circuit diagrams of object circuitries No. 5 and 6 which are formed by cutting the trimmer joint portions of the basic bus bar circuit components and associated bus bar trimming and conducting patterns.
Figure 6:
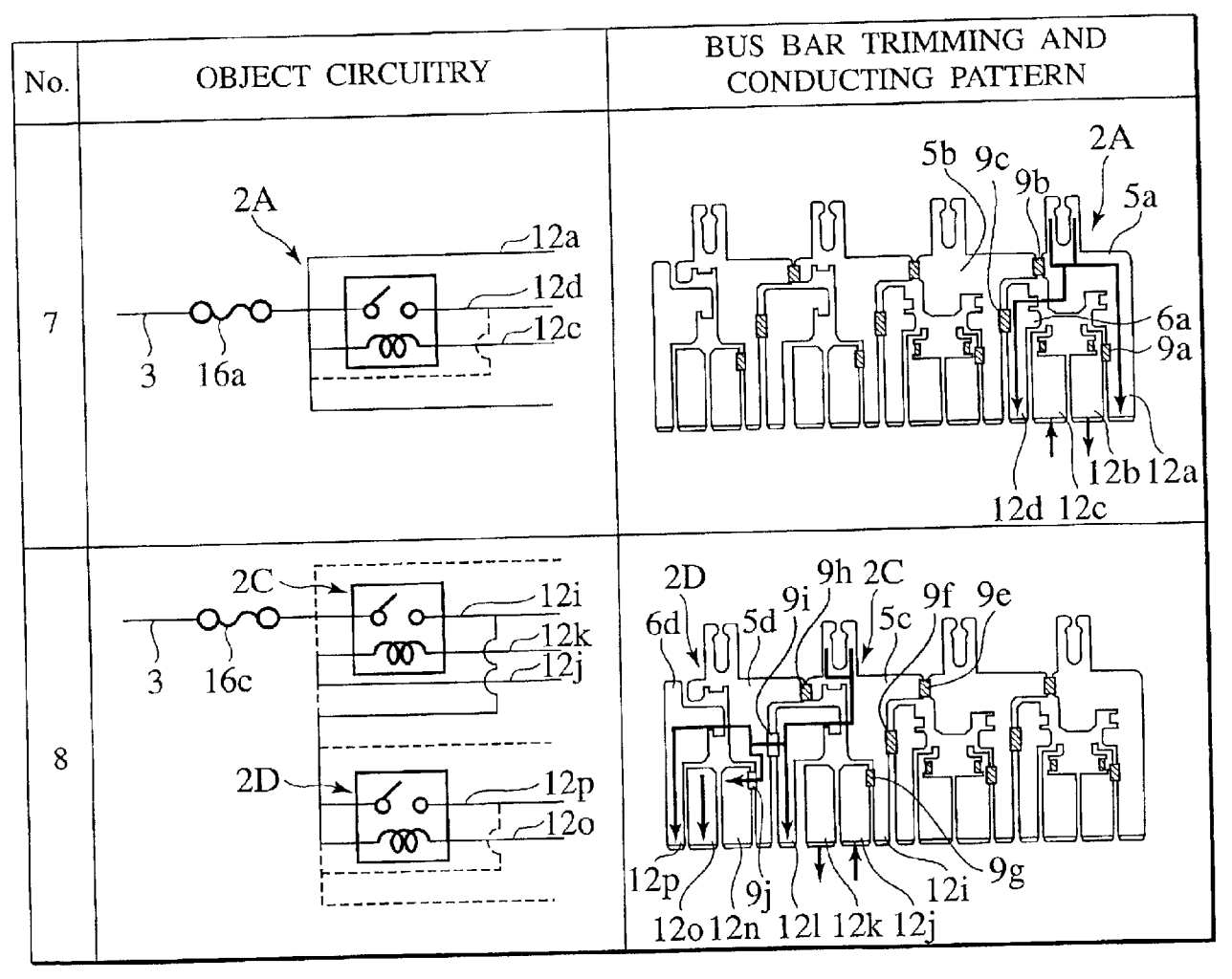
Figure 7:
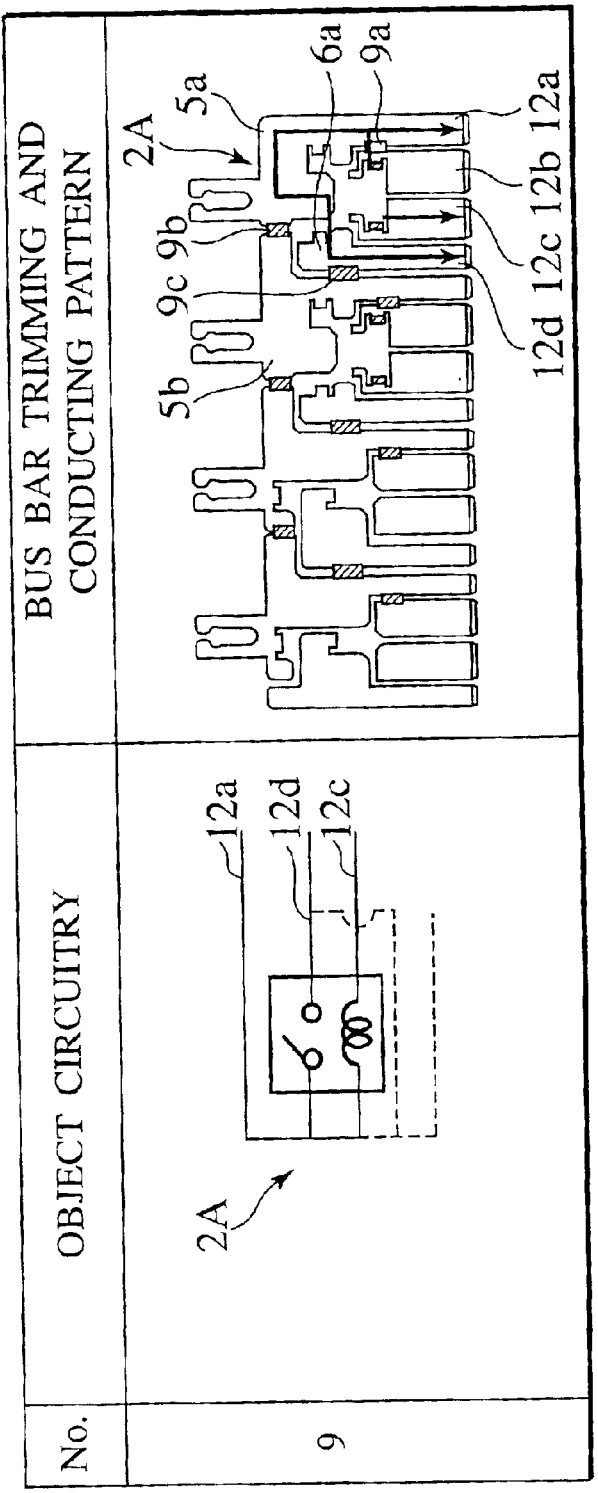
FIG. 7 is a view illustrating a circuit diagram of an object circuitry No. 9 which is formed by cutting the trimmer joint portions of the basic bus bar circuit components and associated bus bar trimming and conducting patterns.

Now, a detailed description will be given to show how an object circuitry is constructed by suitably cutting or trimming suitable parts of the plurality of trimmer joint portions 9a to 9j. FIG. 4 is a view illustrating a circuit diagram for object circuitries No. 1 to No. 4 and associated bus bar trimming and conducting patterns formed in the basic bus bar circuit body 4. FIG. 5 a view illustrating a circuit diagram for object circuitries No. 5 and No. 6 and associated bus bar trimming and conducting patterns formed in the basic bus bar circuit body 4. FIG. 6 is a view illustrating a circuit diagram for object circuitries No. 7 and No. 8 and associated bus bar trimming and conducting patterns formed in the basic bus bar circuit body 4. FIG. 7 a view illustrating a circuit diagram for an object circuitry No. 9 and an associated bus bar trimming and conducting pattern formed in the basic bus bar circuit body 4. In FIGS. 4 to 7, trimmer areas of the trimmer joint potions 9a to 9j to be cut out are shown with black areas and non-trimmer areas of the trimmer joint portions 9a to 9j are indicated with hatched areas.

The object circuitry No. 1 is a through-circuit which is electrically conductive at all times to pass electric power current through the fuse 16a. For example, when using the relay 2A, electric power is supplied from the power supply bus bar 3 and is outputted from the relay terminal 12a. In this case, a desired object circuitry is formed by cutting out (trimming) all the trimmer joint portions 9a to 9c related with the relay 2A.

The object circuitry No. 2 is a relay circuit wherein power supply current is not supplied through the fuse 16a and which is turned on or turned off in response to a high or low level of a control signal (not shown). For example, when using the relay 2A, electric power is supplied from the relay terminal 12a, and a pair of the relay terminals 12b, 12c serve as a control terminal to output electric power from the relay terminal 12d. In this case, also, a desired object circuitry is formed by cutting out (trimming) all the trimmer joint portions 9a to 9c related with the relay 2A.

The object circuitry No. 3 is a relay circuit wherein power supply current is supplied through the fuse 16a and which is turned on or turned off in response to the high or low level of the control signal (not shown). For example, when using the relay 2A, electric power is supplied from the power supply bus bar 3, and a pair of the relay terminals 12b, 12c serve as the control terminals, respectively, to output electric power from the relay terminal 12d. In this case, also, a desired object circuitry is formed by cutting out (trimming) all the trimmer joint portions 9a to 9c related with the relay 2A.

The object circuitry No. 4 is a relay circuit wherein power supply current is supplied through the fuse 16a to the two relay terminals 12c, 12d which are electrically conductive at all times. For example, when using the relay 2A, electric power is supplied from the power supply bus bar 3, allowing power supply current to be outputted through the pair of the relay terminals 12c, 12d. In this case, also, a desired object circuitry is formed by cutting out (trimming) the trimmer joint portions 9b, 9c without cutting out the trimmer joint portion 9a among the trimmer joint portions 9a to 9c related with the relay 2A.

The object circuitry No. 5 is a power supply circuit wherein power supply current is supplied through the fuse 16a to the four relay terminals 12c, 12d, 12g, 12h which are rendered electrically conductive at all times. For example, when using the relays 2A, 2B, electric power is supplied from the power supply bus bar 3 and is outputted through the four relay terminals 12c, 12d, 12g, 12h. In this case, a desired object circuitry is formed by cutting out (trimming) the trimmer joint portions 9c, 9e, 9f without cutting out the remaining trimmer joint portions 9a, 9b, 9d among the trimmer joint portions 9a to 9f related with the relays 2A, 2B.

The object circuitry No. 6 is a relay circuit wherein power supply current is supplied through the fuse 16a and is branched into the two relays 2A, 2B through which branched electric current flows are supplied in response to the high and low level of the respective control signals to be applied to the relays 2A, 2B. For example, when using the relays 2A, 2B, electric power is supplied from the power supply bus bar 3, allowing power supply current to be outputted through the relay terminals 12d, 12h with the actions of the respective control terminals formed with the two pairs of the relay terminals 12b, 12c, 12f, 12g. In this case, a desired object circuitry is formed by cutting out (trimming) the trimmer joint portions 9a, 9c to 9f without cutting out the trimmer joint portion 9b among the trimmer joint portions 9a to 9f related with the relays 2A, 2B.

The object circuitry No. 7 is a relay circuit wherein power supply current is supplied through the fuse 16a and is branched into the two branched power supply current flows which are controlled in response to the high and low level of a single control signal. For example, when using the relay 2A, electric power is supplied from the power supply bus bar 3, and the pair of the relay terminals 12b, 12c serve as the control terminals, respectively, to output electric power from the relay terminals 12a, 12d. In this case, a desired object circuitry is formed by cutting out (trimming) all the trimmer joint portions 9a to 9c related with the relay 2A.

The object circuitry No. 8 is a relay circuit wherein power supply current is branched through the fuse 16c into three branched current flows which are controlled in response to the high and low level of the single control signal. For example, when using the relays 2C, 2D, electric power is supplied from the power supply bus bar 3, allowing power supply current to be outputted through the three relay terminals 12l, 12o, 12p with the actions of the respective control terminals formed with the pair of the relay terminals 12*j*, 12*k*. In this case, a desired object circuitry is formed by cutting out (trimming) the trimmer joint portions 9*e* to 9*g* without cutting out the trimmer joint portions 9*i*, 9*j* among the trimmer joint portions 9*e* to 9*j* related with the relays 2C, 2D.

The object circuitry No. 9 is a relay circuit wherein power supply current is not supplied through the fuses 16*a* to 16*d* and the two relay terminals 12*c*, 12*d* are electrically conductive at all times. For example, when using the relay 2A, electric power is supplied from the relay terminal 12*a*, allowing power supply current to be outputted through the pair of the relay terminals 12*c*, 12*d*. In this case, a desired object circuitry is formed by cutting out (trimming) the trimmer joint portions 9*b*, 9*c* without cutting out the trimmer joint portion 9*a* among the trimmer joint portions 9*a* to 9*c* related with the relay 2A.

It will now be appreciated from the foregoing description that a desired mounting circuit can be formed in an arbitrary combination of either one of or more than two object circuitries discussed above. A detailed example of a practical mounting circuit will be described below in conjunction with FIGS. 8 and 9, with FIG. 8 showing a circuit diagram while FIG. 9 showing a particular basic bus bar circuit body 4 formed in a particularly trimmed condition in a desired conductive pattern to form the practical mounting circuit.

Figure 8:
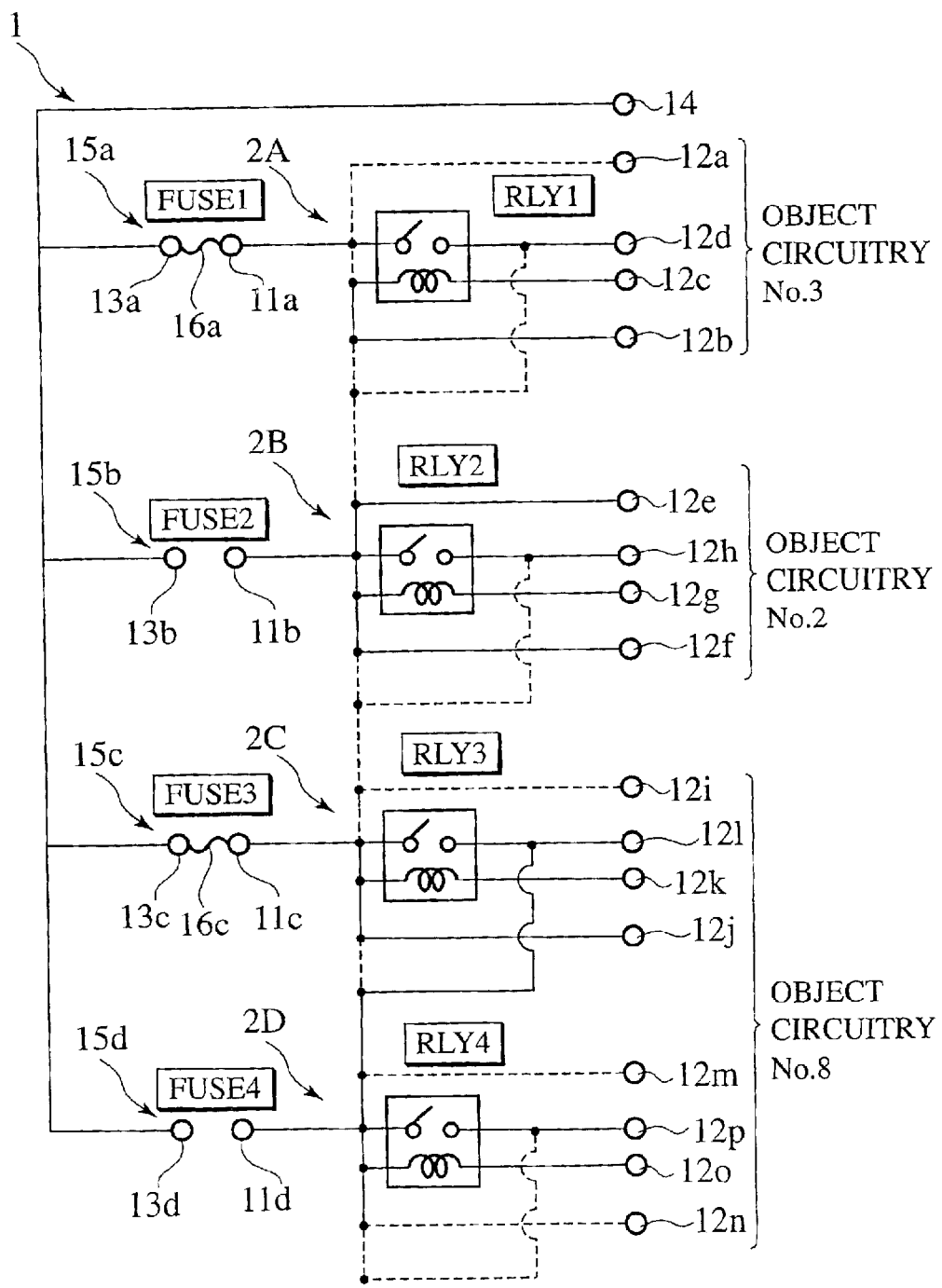
FIG. 8 is a circuit diagram illustrating a detailed example of a practical mounting circuit forming the relay unit of the first preferred embodiment according to the present invention.
Figure 9:
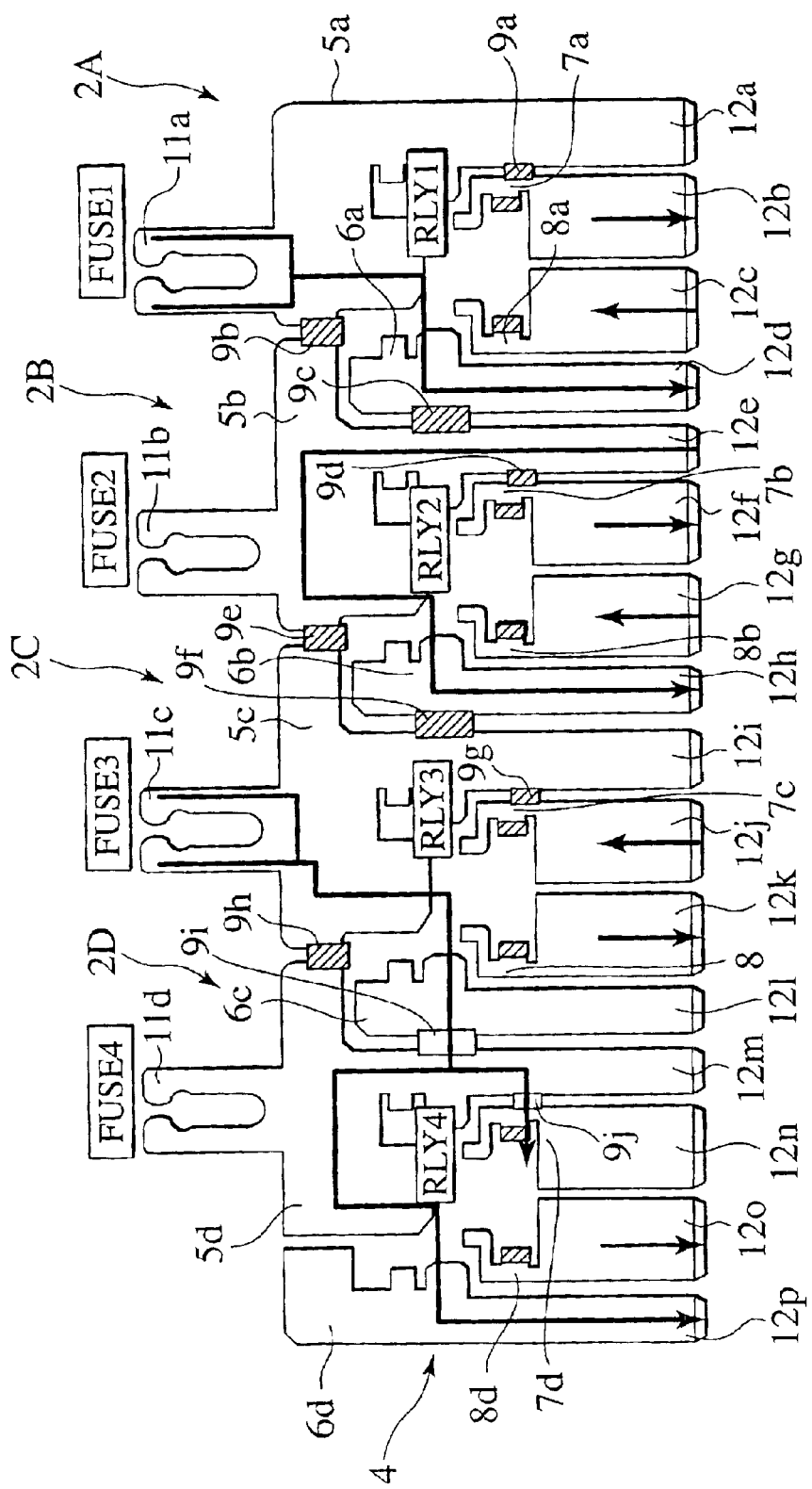
FIG. 9 is a structural view illustrating cutting out conditions and associated circuit patterns which form the practical mounting circuit of the relay unit of the first preferred embodiment according to the present invention.

As viewed in FIG. 8, the mounting circuit is composed of the object circuitries Nos. 3, 2 and 8, which are employed in a combined state. In the object circuitry No. 3, the relay 2A is employed under a condition where the three trimmer joint portions 9*a*, 9*b*, 9*c* are cut out. Then, electric power is supplied from the power supply bus bar 3 via the fuse 16*a*, with the pair of the relay terminals 12*b*, 12*c* serving as the control terminals, respectively, whereas the relay terminal 12*d* serves as the output terminal. In the object circuitry No. 2, the relay 2B is employed under a condition where the three trimmer joint portions 9*d*, 9*e*, 9*f* are cut out. Then, electric power is supplied from the relay terminal 12*e*, and the pair of the relay terminals 12*f*, 12*g* serve as the control terminals, respectively, whereas the relay terminal 12*h* serves as the output terminal. In the object circuitry No. 8, the relays 2C, 2D are employed under a condition where the two trimmer joint portions 9*g*, 9*h* are cut out. Then, electric power is supplied from the power supply bus bar 3 via the fuse 16*c*, and the pair of the relay terminals 12*j*, 12*k* serving as the control terminals, respectively, whereas the relay terminals 12*l*, 12*o*, 12*p* serve as the output terminals, respectively.

As will be apparent from the foregoing description, in the relay unit 1 of the first preferred embodiment, various circuit patterns can be formed by trimming the plurality of the trimmer joint portions 9*a* to 9*j* at desired trimmer cutting points. This results in an easy to comply with variations in a circuit pattern of the mounting circuit with a mere trimming operation at suitable cutting points among the trimmer joint portions 9*a* to 9*j*. When it is desired to interconnect the switch connector bars 5*a* to 5*d*, 6*a* to 6*d*, 7*a* to 7*d* and 8*a* to 8*d* to one another, the trimmer joint portions 9*a* to 9*j*, which are joined to the switch joint bus bars 5*a* to 5*d*, 6*a* to 6*d*, 7*a* to 7*d* and 8*a* to 8*d*, remain untrimmed. As a consequence, it is easy to perform a joint absorption among the switch connector bus bars 5*d*, 6*a* to 6*d*, 7*a* to 7*d* and 8*a* to 8*d* and also a joint absorption of wire harnesses (not shown).

In the first preferred embodiment discussed above, further, since the plurality of trimmer joint portions 9*a* to 9*j* intervene between the switch connector bus bars 5*a* to 5*d* in one part and the coil connector bus bars 7*a* to 7*d* in the other part in the same relays 2A to 2D and, in the different relays 2A to 2D, the plurality of trimmer joint portions 9*a* to 9*j* intervene between the pairs of the switch connector bus bars 5*a* to 5*d* and 6*a* to 6*d* and the switch connector bus bars 5*a* to 5*d* in the other part, cutting out the trimmer joint portions 9*a*, 9*d*, 9*g*, 9*j* located in the same relays 2A to 2D for trimming allows pairs of the coil connector terminals 12*b*, 12*c*, 12*f*, 12*g*, 12*j*, 12*k*, 12*n*, 12*o* to be used as control terminals while compelling the coil joint terminals to serve as the through-circuits without cutting out the aforementioned trimmer joint portions 9*a*, 9*d*, 9*g*, 9*j*. Further, cutting out the trimmer joint portions 9*b*, 9*c*, 9*e*, 9*f*, 9*h*, 9*i* intervening between the different relays 2A to 2D allows the neighboring relays 2A to 2D to be formed into independent circuitries which are separate from one another and, without cutting out the aforementioned trimmer joint portions 9*b*, 9*c*, 9*e*, 9*f*, 9*h*, 9*i*, the neighboring relays 2A to 2D may be utilized as mixed circuitries. Consequently, it is possible for a variety of circuitries in various circuit patterns to be obtained in an easy fashion in a low manufacturing cost.

In the aforementioned first preferred embodiment, further, since the switch connector circuit components and the coil connector circuit components are composed of the switch connector bus bars 5*a* 5*d* and 6*a* to 6*d* and the coil connector bus bars 7*a* to 7*d* and 8*a* to 8*d*, a single bus bar forming die may be prepared for complying with the various circuit patterns of the mounting circuit, with a resultant contribution in a reduction of the manufacturing cost of the bus bar forming die. Also, since the respective circuit bodies have increased strengths, the respective circuit bodies may be integrally formed with the respective terminals.

In the first preferred embodiment, further, since the respective switch connector bus bars 5*a* to 5*d* and 6*a* to 6*d* and the coil connector bus bars 7*a* to 7*d* and 8*a* to 8*d* are formed with the respective relay terminals 12*a* to 12*p* to be connected to the respective connectors, there is no need for additionally preparing the relay terminals separate from the relays 2A to 2D, the relay unit may be simplified in structure to have a compact configuration.

In the first preferred embodiment, further, the presence of the switch connector bus bars 5*a* to 5*d*, in one part, integrally formed with the downstream fuse joint portions 11*a* to 11*d* and the relay terminals 12*a*, 12*e*, 12*i*, 12*m*, respectively, both of which extend in opposed relationship allows the downstream fuse joint portions 11*a* to 11*d* and the relay terminals 12*a*, 12*e*, 12*j*, 12*m* to be located in dispersed areas within the unit case. Accordingly, the fuse mounting areas and the connector mounting areas are separately located in different minimum areas, resulting in the relay unit 1 formed in a simplified structure with a compact configuration.

In the first preferred embodiment, also, although the downward fuse joint portions 11*a* to 11*d* protrude upward and the relay terminals 12*a*, 12*e*, 12*i*, 12*m* protrude downward from respective body sections of the switch connector bus bars 5*a* to 5*d*, it is suffice for the downward fuse joint portions and the relay terminals not to be formed in the same orientation, and a modification may be made such that the downward fuse joint portions 11*a* to 11*d* protrude upward while the relay terminals 12*a*, 12*e*, 12*i*, 12*m* protrude in a lateral direction, is desired.

In the aforementioned first preferred embodiment, further, the presence of the plurality of pairs of fuse joint portions 15*a* to 15*d* formed with the downstream fuse joint portions 11*a* to 11*d*, integrally formed with the respective switch connector bus bars 5*a* to 5*d* of the plurality of relays, and the upstream fuse joint portions 13*a* to 13*d*, integrally formed with the power supply bus bar 3, which are located in opposed relationship to one another, enables the fuse joint portions 15*a* to 15*d* to be constructed in a simplified structure with a minimum number of component parts. Thus, the relay unit may be simplified in structure to have a compact configuration.

In the first preferred embodiment, also, although the relay unit 1 has been shown and described as being composed of the four sets of the relays 2A to 2D, the relay unit 1 may include two, three, or more than five relays. In the aforementioned preferred embodiment, further, since the relay unit 1 includes the four sets of the relays 2A to 2D and the nine patterns, the relay unit 1 may have the mounting circuitries in the number of circuit patterns corresponding to the fourth power of nine.

Figure 10:
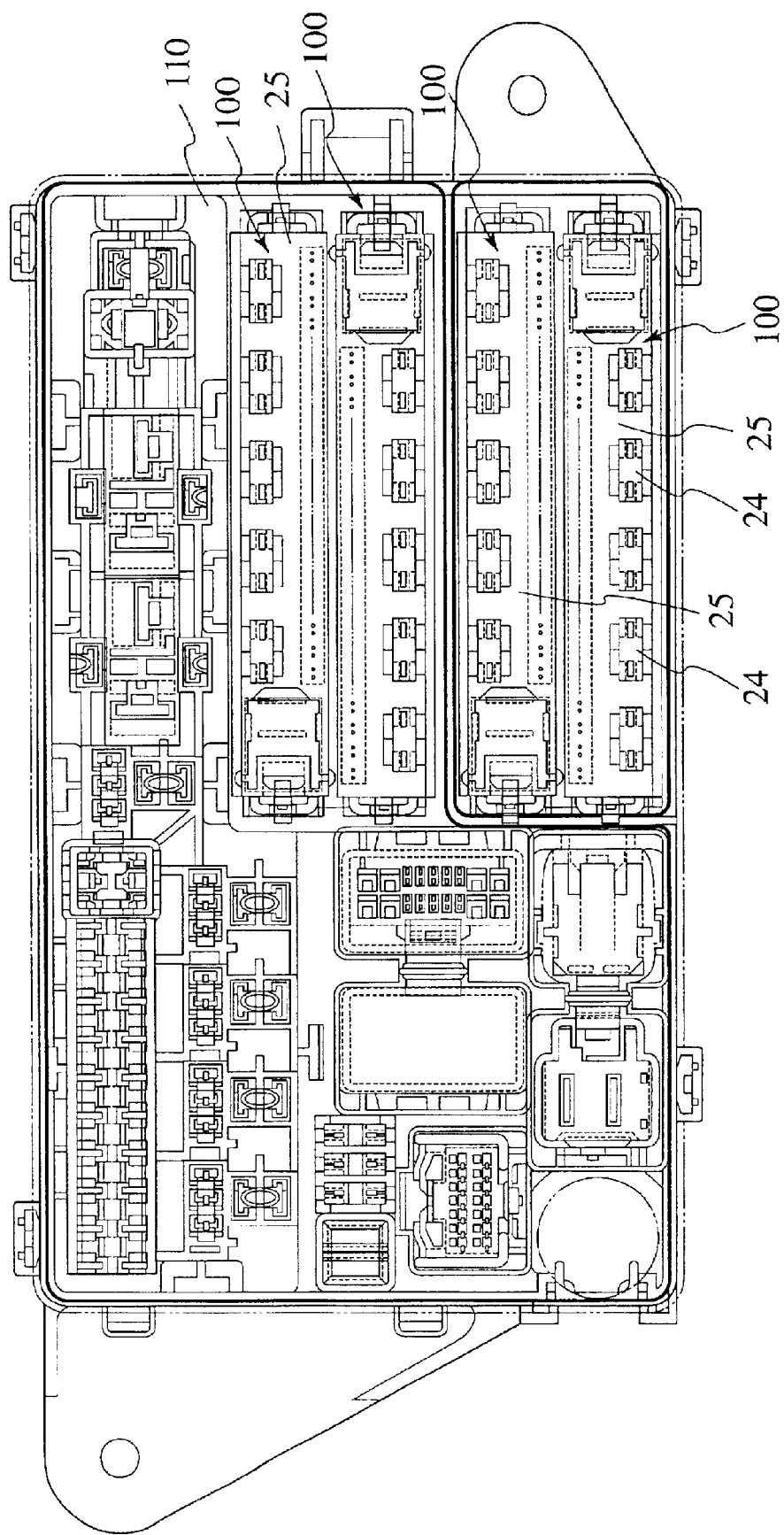
FIG. 10 is a plan view of an electrical junction box of a second preferred embodiment according to the present invention.
Figures 11A, 11B, 11C:
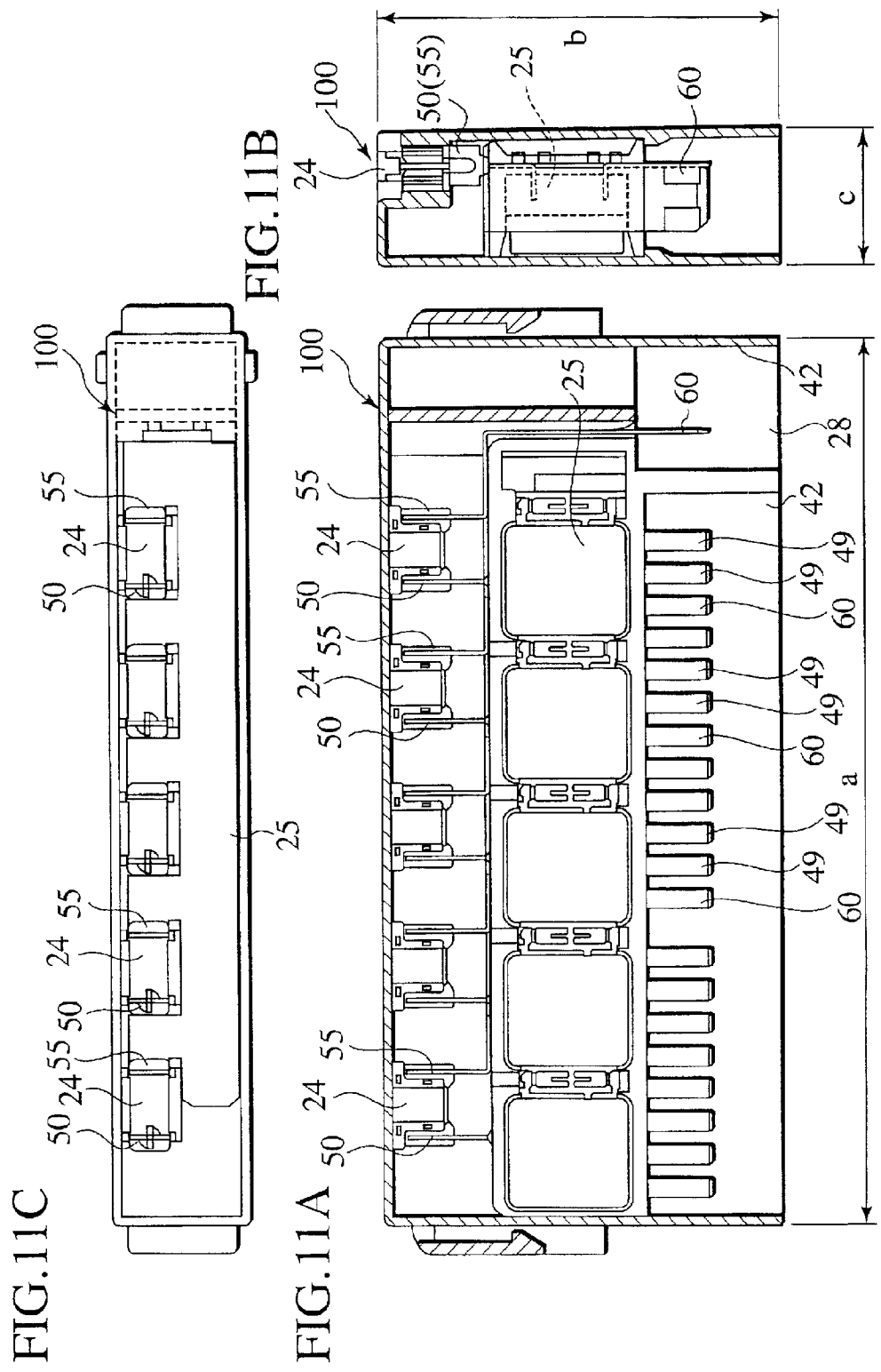
FIGS. 11A, 11B and 11C are a front cross sectional view of the relay of the second preferred embodiment which is unitized, a side cross sectional view of the relay shown in FIG. 11A, and a plan view of the relay shown in FIG. 11A.
Figure 12:
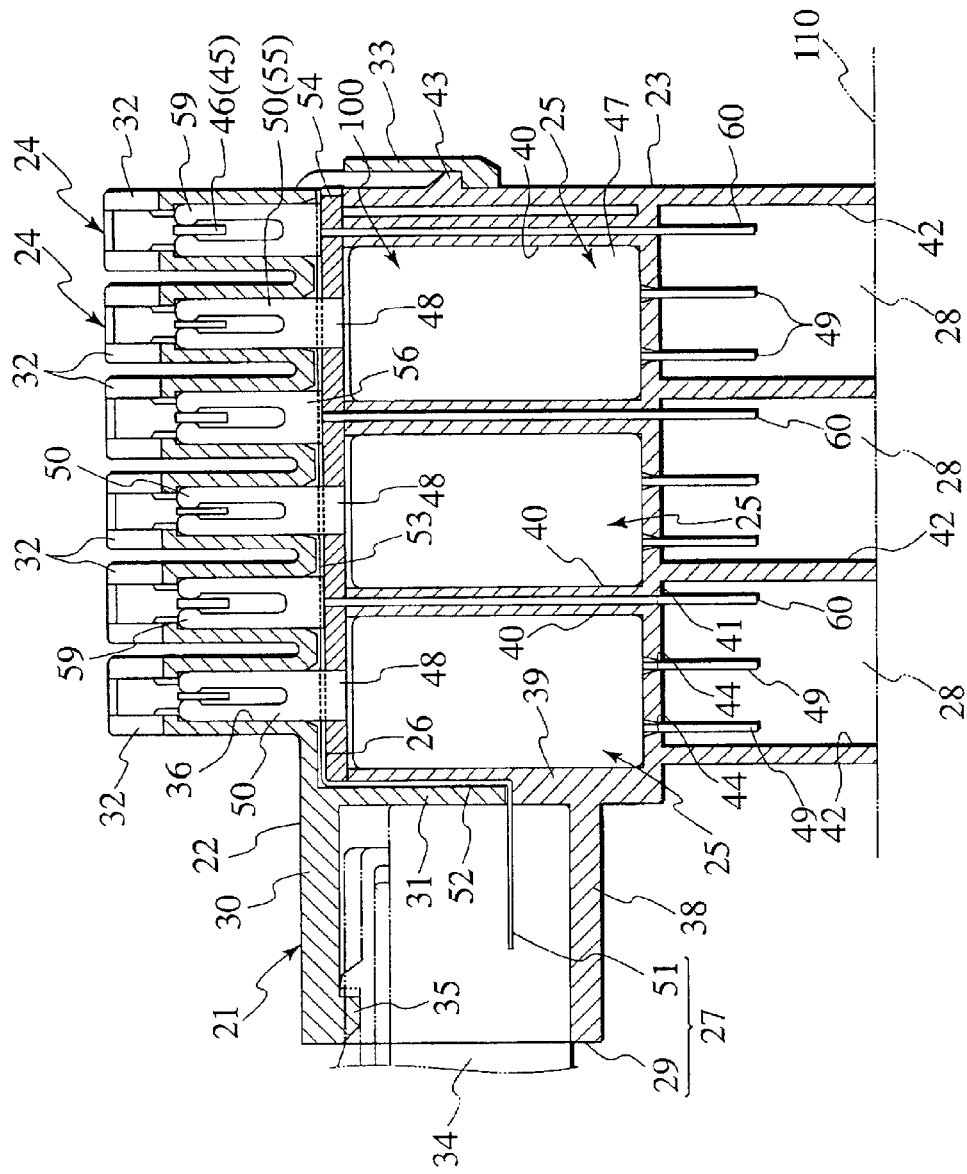
FIG. 12 is a cross sectional view, of the electrical junction box of the second preferred embodiment according to the present invention, which involves a front view of the relay according to the present invention.
Figure 13:
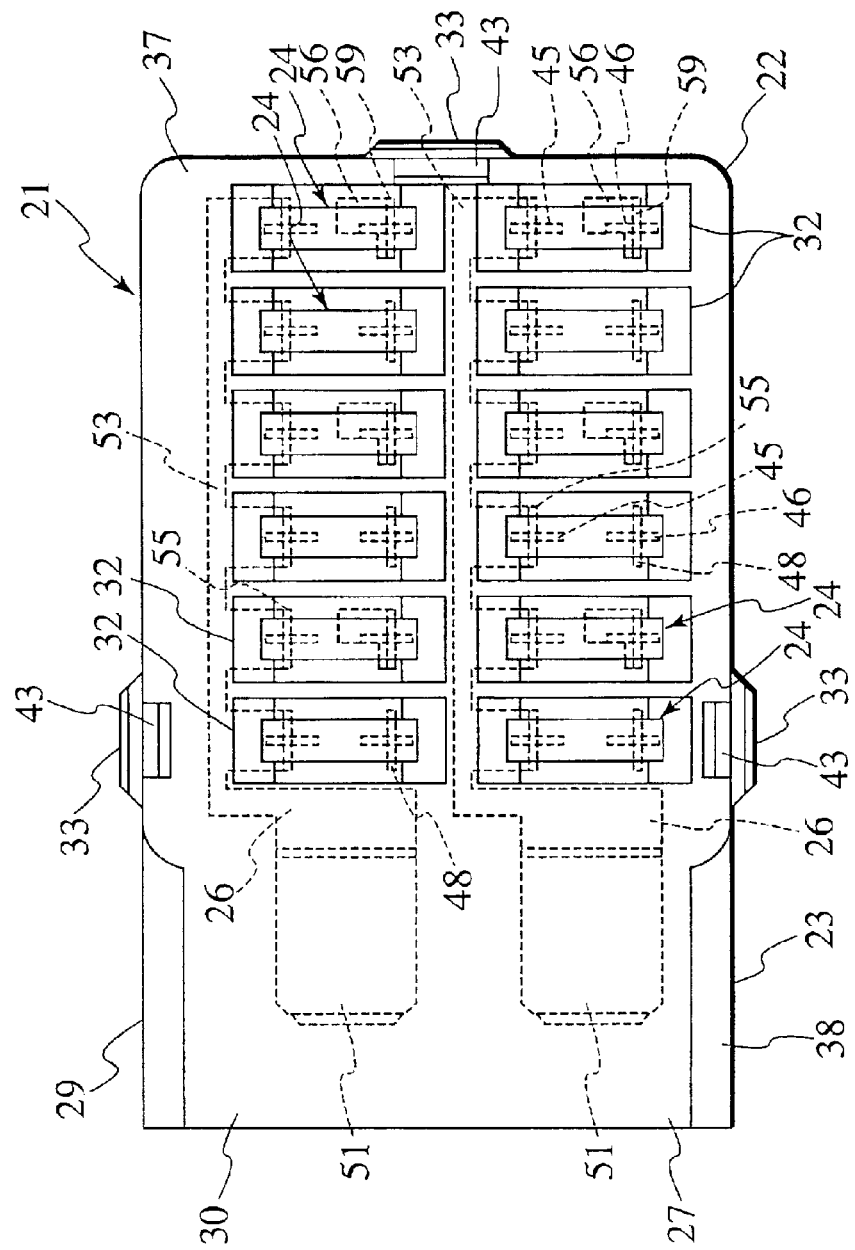
FIG. 13 is a plan view of the electrical junction box shown in FIG. 12.
Figure 14:
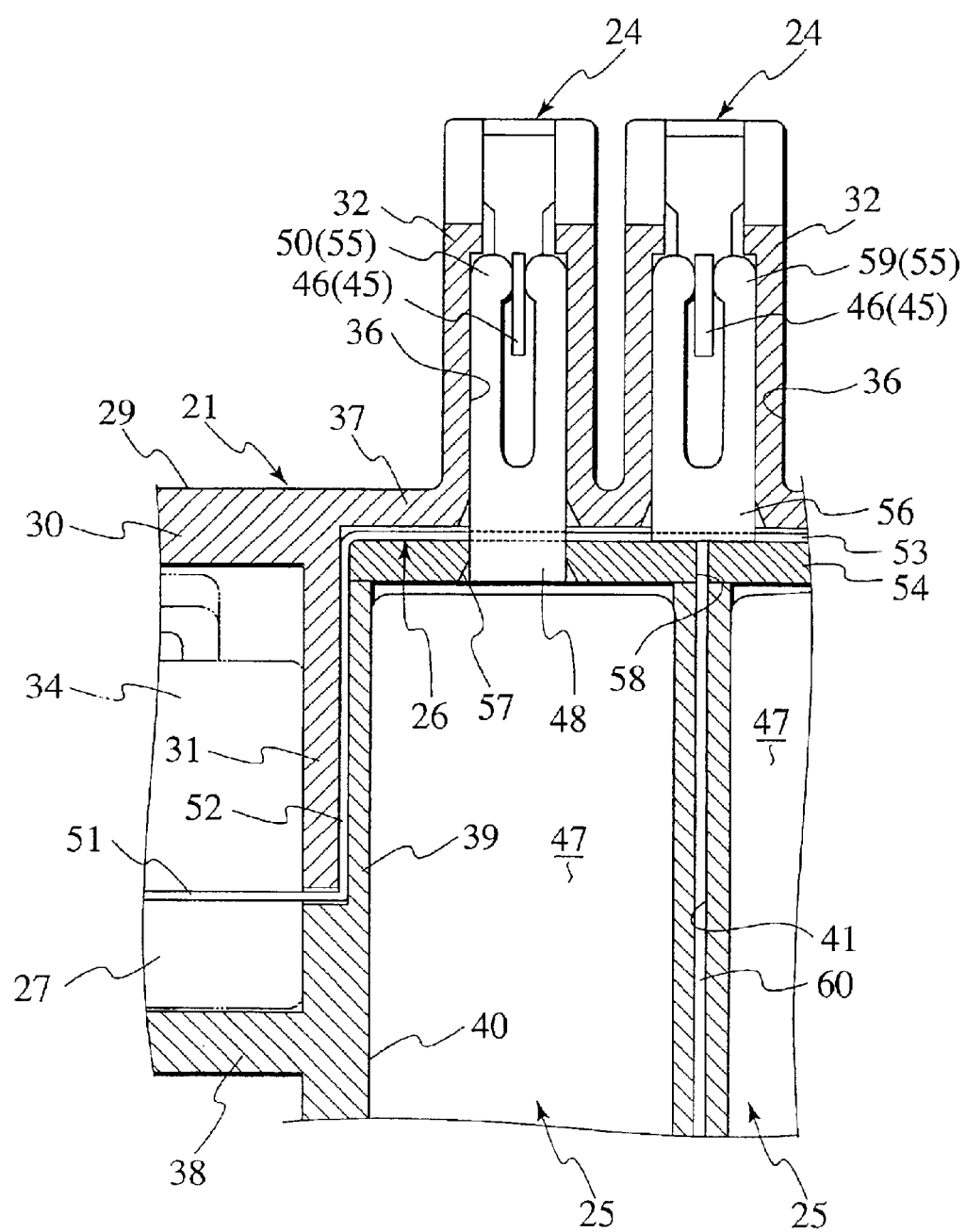
FIG. 14 is an enlarged view illustrating connector portions between the relay and the relevant fuse shown in FIG. 12.

FIGS. 10 to 14 show a relay and an electric junction box of a second preferred embodiment according to the present invention. FIG. 10 is a plan view of the electric junction box. FIGS. 11A to 11C are a front sectional views of the relay unit, a side cross sectional view of the relay unit and a plan view of the relay unit. FIG. 12 is a cross sectional view of the electric junction box (involving the front view of the relay according to the present invention), FIG. 13 is a plan view of the electric junction box shown in FIG. 12, and FIG. 14 is an enlarged cross sectional view illustrating joint areas between the relays and the fuses. It is to be noted here that the words "upward, downward, leftward and rightward" are used as a reference of FIG. 12.

FIGS. 10 to 14 show one practical embodiment of the relays and the electric junction box to be employed in a vehicle such as an automobile. In the second preferred embodiment, as seen in FIG. 10 and FIGS. 11A to 11C, relays 25 are integrally coupled with the fuses 24 via the fuse joint portions 50 to form the relay unit 100, with the relay unit 100 being accommodated in the electric junction box. The relay unit 100 is constructed of the five sets of the relays 25 which, like in the first preferred embodiment, include five sets of relay switches (not shown), relay coils (not shown) and the basic bus bar circuit bodies (not shown). Since the basic bus bar circuit bodies are identical in structure with those of the aforementioned first preferred embodiment except for the number of sets of the basic bus bar circuit bodies, a detailed description of each of the basic bus bar circuit bodies is herein omitted.

The structure of the relay unit 100 and the associated electrical junction box are described below in detail with reference to FIGS. 12 to 14. The electrical junction box includes a box body 21 which is comprised of a main cover 22 made of plastic resin, an undercover 23 made of plastic resin, the plurality of fuses 24 arrayed in a row in parallel relationship with respect to one another and accommodated in the main cover 22, the plurality of fuses 25 arrayed in a row in parallel relationship with respect to one another and accommodated in the undercover 23, and the pair of power supply bus bars 26.

Further, the box body 21 is formed with an electric power supply section 27 to which electric power is supplied from an electric power supply such as a battery (not shown), and a plurality of connector joint portions 28 which are connected to the associated relays and the associated fuses 24.

The main cover 22 is formed with an upper wall 30 and a rear wall 31 which form a hood portion 29 of the electric power supply section 27, a plurality of fuse cavities 32 associated with the respective fuses 24, and a plurality of lock portions 33 which engages the undercover 23.

The upper wall 30 formed on the main cover 22 has a flat shape having a distal end whose inner surface is formed with a lock segment 35 to clamp a connector 34 for supplying electric power to the power supply section 27. Also, the upper wall 30 and the rear wall 31 are formed in a shape so as to intersect with one another at an inner base portion of the upper wall 30.

The respective fuse cavities 32 have desired profiles to allow the associated fuses 24 to be inserted from the respective distal portions in a downward direction. Further, each of the fuse cavities 32 is formed with a terminal receiver compartment 36. In addition, each cavity 32 is formed so as to penetrate in upper and lower directions. In the illustrated embodiment, each fuse cavity has the same shape as that of the related art structure.

In FIG. 12, further, the fuse cavities 32, located at first, third and fifth locations counting from the right side, refer to other fuse cavities which are defined in appended claims. These fuse cavities are located to effectively use spaces in a row in which the relays 25 are arrayed and between the neighboring fuses 24 to which the associated relays 25 are connected.

The lock portions 33 are integrally formed with a fuse cavity forming wall 37, on which the fuse cavities 32 are formed, and extend downward from a peripheral edge thereof.

The undercover 23 is formed with a hood body 38 and a rear wall 39 which form the hood portion 29, a plurality of relay compartments 40 for accommodating the relays 25, respectively, a plurality of through-holes 41 formed between the adjacent relay compartments 40, a plurality of hood compartments 42 which form the connector joint portions 28, respectively, and a plurality of lock segments 43 formed in respective projections which engage the lock portions 33 of the main cover 22.

The hood body 38 is formed in the undercover 23 in a C-shape in cross section (as viewed from a connecting direction of the connector 34). Also, the hood body 38 is formed in a structure to clamp the upper wall 30 of the main cover 22 through some suitable means.

On the other hand, the rear wall 39, which is formed at a bottom area of the hood 38, is formed to allow the aforementioned power supply bus bar 26 to be sandwiched between the rear wall 31 of the main cover 22 and the rear wall 39 to retain the same in a fixed place. Further, the rear wall 39 forms a part of the relay compartment 40, which is closest to the electric power supply section 27, and also serves as a resting member to support a substrate 54 which will be discussed later.

The relay compartment 40 is shaped to have a profile to comply with an external shape of the relay 25 for fully accommodating the relay 25. Also, the relay compartment 40 has a bottom wall formed with a plurality of terminal insertion slots 44 which communicate with an inner side of the relay compartment 40. Also, the through-hole 41 communicates with an inner side of the hood portion 42 in the same manner as the terminal insertion slots 44.

Although each fuse 24 is of the same structure as the related art practice and a detailed description of the same is herein omitted, each fuse 24 is constructed of a tab-shaped upstream terminal 45, a tab-shaped downstream terminal 46, and a soluble body (not shown) intervening between the upstream and downstream terminals.

The aforementioned relay 25 is constructed of a circuit substrate (not shown) which is made of plastic resin, an outer cover 47 formed in a box shape and enclosing the circuit substrate, a relay coil (not shown) internally located in the outer cover 47, a one terminal 48 which extends upward from an upper wall of the outer cover 47, and three other terminals (with only two terminals being shown) 49 which extend from the aforementioned circuit substrate via the terminal insertion slots 44. In the illustrated preferred embodiment, further, the one terminal 48 extends straightly upward, whereas the other terminals (which correspond to the relay terminals 12a to 12p of the first preferred embodiment) 49 extends straightly downward.

The one terminal 48 is formed at its one end with a fuse connector portion 50 shaped in a bifurcated profile to be connected to the downstream terminal 46 of the fuse 24. Further, the other end of the one terminal 48 is formed with a contact which is located inside the outer cover 47.

On the other hand, all of the three terminals 49 are formed in tab-shapes and form the connector joint portions 28, respectively.

It is to be noted that the one terminal 48 may not extend through the upper wall of the outer cover 47 but through a side wall thereof. In such a case, although the relays 24 are arrayed in a right and left direction of the relays 25 such that the relay unit may encounter a difficulty in obtaining the same miniaturization result as that obtained in the box body 21 of the presently filed preferred embodiment, it is possible to obtain an improved workability in a reliable manner as will be described later.

The aforementioned power supply bus bar 26 is comprised of a tab 51 which forms a part of the power supply section 27, a first intermediate component 52 which is sandwiched between the rear wall 31 of the main cover 22 and the rear wall 39 of the undercover 23, and a second intermediate component 53 located in a plane parallel to the aforementioned upper walls of the relays 25. Further, second intermediate component 53 of the power supply bus bar 26 is placed on the circuit substrate made of plastic resin and fixed thereto.

The tab 51 of the power supply bus bar 26 is located so as to protrude inside the hood body 38 to allow electric power to be supplied through the tab 51. Further, the second intermediate component 53 of the power supply bus bar 26 is formed with a plurality of upwardly extending fuse connector portions 55 to which the upstream terminals 45 of the fuses 24 are connected, respectively. Each connector portion 55 is formed in the same shape as the fuse connector portion 50 formed in the one terminal 48 (with the fuse connector portions 55 being located in a rear side of the fuse connector portion 50 in FIGS. 12 and 14 and bearing the respective reference numerals enclosed in parentheses).

Located on respective distal ends of the rear wall 39 and the relay compartments 40 is the circuit substrate 54, to which the aforementioned power supply bus bar 26 and the plurality of bus bars 56, which is different from the power supply bus bar 26, are fixedly connected. Further, the circuit substrate 54 is formed with a plurality of through-bores 57 through which the associated terminals 48 of the respective relays 25 extend, and a plurality of through-holes 58 located for the bus bars 56. The through-holes 58 are formed in alignment with the through-holes 41 of the undercover 23.

One end of each bus bar 56, which is placed on the circuit substrate 54 and fixed thereto independently of the power supply bus bar 26, is formed with a plurality of fuse connector portions 59 to be connected to the downstream terminals 46 of the associated fuses 24 to be inserted through the first, third and fifth fuse cavities 32 counting from the right side in FIG. 12. Also, the other end of each bus bar 56 is formed with an elongated tab 60 which extends through the through-hole 58 of the circuit substrate 54 and the through-hole 41 of the undercover 23 and which forms a part of each connector portion 28 together with the other terminals 49 of the relay 25.

Now, a detailed description will be given below on how the box body 21 of the electrical junction box of the present invention is assembled.

Initially, a first step is carried out for placing and receiving the relays 25 in the respective relay compartments 40 of the undercover 23. In particular, each relay 25 is inserted into the relevant relay compartment 40 from the side of the other terminals 49. Then, upon fully receipt of the relay 25, the other terminals 49 of the relay 25 protrude into the relevant hood portion 42 via the associated terminal insertion slots 44. Also, only the one terminal 48 of the relay 25 extends upward from the relay compartment 40.

Under such a condition, a second step is carried out for locating the circuit substrate 54, on which the power supply bus bars 26 and 56 are placed and fixed thereto, on the upper distal ends of the respective relay compartments 40. In particular, the circuit substrate 54 is placed on the upper distal ends of the relay compartment 40 while allowing the one terminal 48 of the relay 25 to be inserted through the relevant through-hole 57 while, at the same time, allowing the tab 60 of the bus bar 56 to be inserted through the relevant through-hole 41 of the undercover 23. Then, the circuit substrate 54 is fully placed over the upper distal ends of the respective relay compartments 40 and, when the tab 60 of the bas bar 56 protrudes inside the hood portion 42, the connector joint portion 28 is formed.

In a consecutive operation, a third step is carried out for permitting the main cover 22 to be mated with the undercover 23. When the lock portions 33 of the main cover 22 engage the lock segments 43 of the undercover 23, the power supply bus bar 26 and the associated circuit substrate 54 are held in a sandwiched state between the main cover 22 and the undercover 23 and retained in a fixed place. Also, in this instance, terminal receiver compartment 36 of each fuse cavity 32 receives therein the fuse connector portion 50 of the one terminal 48 of the relay 25, the fuse connector portion 55 of the power supply bus bar 26, the fuse connector portion 59 of the bus bar 56 and the fuse connector portion 55 of the power supply bus bar 26.

Then, lastly, under a circumstance described above, the fuses 24 are inserted into the relevant fuse cavities 32 such that the upstream terminal 45 and the downstream terminal 46 are connected to the relevant fuse connector portion 50 of the one terminal 48 of the relay 25, the fuse connector portion 55 of the power supply bus bar 26, the fuse connector portion 59 of the bus bar 56 and the fuse connector portion 55 of the power supply bus bar 26, thereby completing a series of assembling steps.

In the absence of a particular relay which is not desired for connection, it is also possible for a part of the bus bar which is formed in a particular circuit pattern to be used as a junction connected in place of a joint terminal which is formed in a separate component part.

From the foregoing description given above, according to the electrical junction box of the second preferred embodiment shown in FIG. 11, since the relay unit 100 is constructed of the relays 25 and the fuse 24 which are unitized with one another by unitarily coupling the fuses 24 with the relays 25 via the fuse connector portions 50, there is no need for providing electrical wirings between the relay and the relevant fuse 24, with a resultant improved workability in assembly of the relay unit. Further, the presence of the fuses 24 located in a stacked state with respect to the relay 25 allows the respective accommodating space to be formed in a compact structure, thereby enabling a miniaturization of the electrical junction box.

According to the relay 25 of the second preferred embodiment, further, as seen in FIGS. 12 to 14, since the one terminal 48 and the other terminals 49 are formed at locations different from one another while the one terminal 48 is formed with the fuse connector portion 50, it is possible for the downstream terminal 46 of each fuse 24 to be directly connected to the connector portion 50. Accordingly, there is no need for providing discrete electrical wirings that would be required between the relays 25 and the fuses 24 in the related art structure, providing an ease of laminating the fuses 24 on the upper side of the relays 25 for thereby improving an assembling workability.

Further, assuming that the location of the other terminals 49 bears at a lower side of the relay 25, the location of the one terminal 48 is formed at a side portion or an upper portion whereby, especially when the one terminal 48 is located in the upper portion, the fuse 24 is placed in the stacked state with respect to the relay 25, with a resultant miniaturization of the electrical junction box.

According to the electrical junction box of the present invention, also, the presence of the relay 25 having the aforementioned advantages enables the electrical junction box to be formed such that the downstream terminal 46 of the fuse 24 can be directly connected to the fuse connector portion 50 of the relay 25. That is, inserting the fuse 24 into the fuse cavity 32, under a condition wherein the relay 25 is received in the relay compartment 40, allows the electrical junction box to be constructed such that the one terminal 48, which is inserted into the relevant fuse cavity 32, of the relay 25 is brought into direct electrical contact with the downstream terminal 46 of the fuse 24. Consequently, the relay 25 and the fuse 24 can be connected to one another without the need for the electrical wiring, resulting in an improved workability.

According to the electrical junction box of the present invention, the presence of the relay 25 having the advantages described above enables the fuses 24 to be received in the stacked state with the relevant relays 25 within the electrical junction box. Thus, such an arrangement allows the electrical junction box to be miniaturized.

According to the electrical junction box, further, the presence of the connector joint portions 28 allows the electrical junction box to be constructed such that a package of the wire harnesses can be connected to the other terminals 49 of the relay 25 through a connector joint. Therefore, there is no need for troublesome load works for individually locating separate terminals with electrical wirings onto relevant positions corresponding to the other terminals 49 of the relay 25 one by one, with a resultant improved assembling workability.

According to the electrical junction box of the present invention, furthermore, the presence of the power supply bus bar 26 enables electrical connection between the upstream terminal 45 of the fuse 24 and the power supply section 27. As a consequent, there is no need for connecting the above component parts together with electric wires one by one, resulting in an improved workability.

An electrical junction box of a third preferred embodiment is described below in detail with reference to FIG. 15, with like parts bearing the same reference numerals as those used in the aforementioned second preferred embodiment to omit a redundant description of the same parts. In the third preferred embodiment, the relay unit 100 is placed such that a projected area of the relay unit 100, which lies in a minimum value, is placed in a plane perpendicular to a mounting surface 110 on which the electrical junction box is secured.

More particularly, assuming that the dimension of the relay unit 100 composed of the relays 25 and the fuses 24 which are unitized to one another has a length a in FIG. 11A, and a height b and a width c in FIG. 11B, then, a formula is expressed as: a>b>c.

Figure 15:
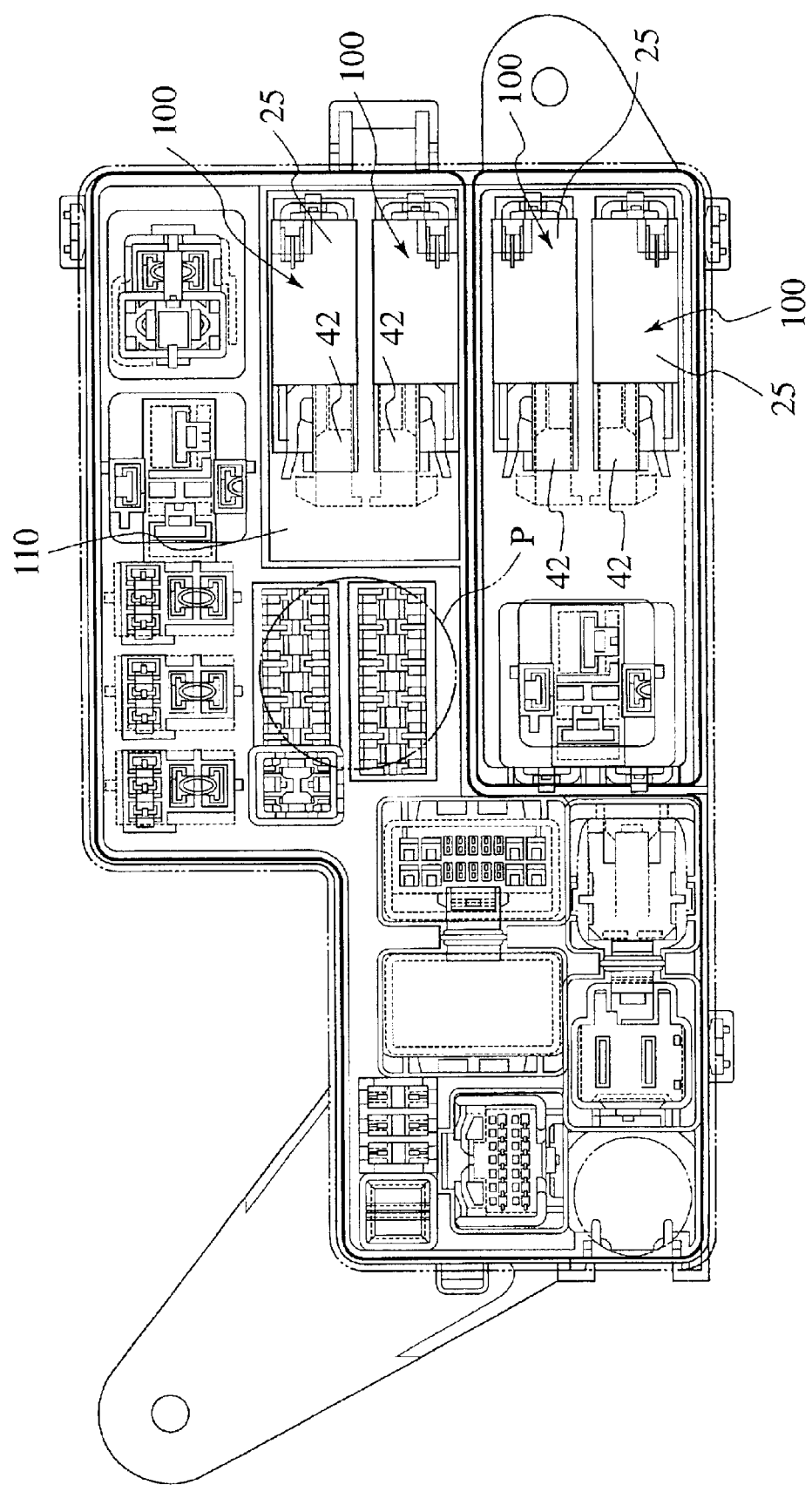
FIG. 15 is a plan view of an electrical junction box of a third preferred embodiment according to the present invention.

Accordingly, the relay unit 100 has the minimum projected area enclosed with the height direction (i.e. the dimension b) and the widthwise direction (i.e. the dimension c), and FIG. 15 is a plan view illustrating a structure wherein the side face of the relay unit 100 in received in the mounting surface 110 in opposed relationship thereto. That is, locating the side face of the relay unit 100 in a plane opposed to the mounting surface 110 allows the lengthwise direction (i.e. the dimension a) of the relay unit 100 to lye in a plane perpendicular to the mounting surface 110, with the relay unit 100 being received in the electrical junction box in a vertical state.

Thus, in the third preferred embodiment, since the relay unit 100 is contained in the electrical junction box in the vertical state, the contained surface area occupied in the electrical junction box is decreased, resulting in a miniaturization of the electrical junction box as seen in FIG. 15. With such an arrangement, while the electrical junction box has a rectangular shape in a plane configuration with the structure shown in FIG. 10, the presence of the relay unit 100 placed in the vertical mode enables a blank space, to be formed at an area circled at P as seen in FIG. 15, for permitting other electronic components or associated circuits to be mounted, resulting in a decrease in a whole planar surface area of the electrical junction box. This results in an easy layout to be achieved when mounting the electrical junction box in a narrow engine room or a lower area of a dashboard.

Figure 16:
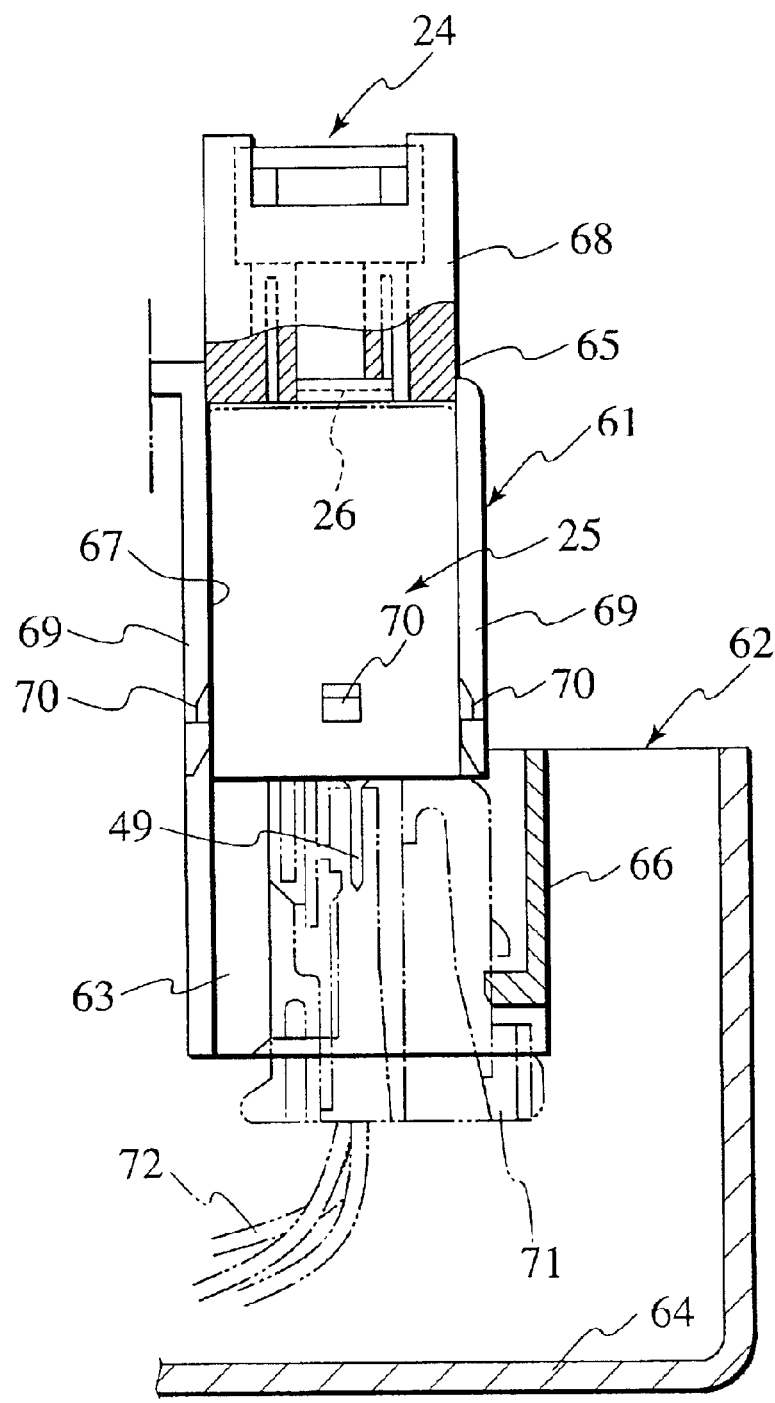
FIG. 16 is a cross sectional view of an electrical junction box of a fourth preferred embodiment according to the present invention.

FIG. 16 is a cross sectional view illustrating an electrical junction box of a fourth preferred embodiment according to the present invention, with like parts bearing the same reference numerals as those used in the aforementioned illustrated embodiments for omitting a redundant description of the same component parts. In the fourth preferred embodiment, the electrical junction box is constructed of a box body 61 and a lower cover 62, with the box body 61 being formed with connector joint portions 63 whose bottom walls are spaced from a bottom wall 64 of the lower cover 62 by a given distance. Also, it is to be noted that the box body 61 and the lower cover 62 are fixedly secured to one another with suitable fixtures.

More particularly, the box body 61 is constructed of a main cover 65, the aforementioned fuses 24, the aforementioned relays 25 and the aforementioned power supply bus bar 26. Further, the main cover 65 is formed with a hood section 66, relay compartments 67 and fuse cavities 68 in a sequence from the bottom wall 64 of the lower cover 62. Each of the relay compartments 67 is formed with a slit 69 with which a lock 70 of the relay 25 is brought into engagement when the relay 25 is received in the relay compartment 67 to preclude the relay 25 from being dislocated.

Also, the aforementioned fuses 24, the aforementioned relays 25 and the aforementioned power supply bus bar 26 are electrically connected to one another in the same manner as those of the preferred embodiments described above. Therefore, a detailed description of the same is herein omitted.

With the structure described above, when the relay 25 is received in the relay compartment 67, the other terminals 49 protrude into the hood section 66 to form the connector joint portion 63. Then, the connector 71 is connected to the connector joint portion 63 through the connector coupling.

Since the connector joint portion 63 is spaced from the bottom wall 64 of the lower cover 62 by the given distance, a sufficient space is enhanced for achieving the connector coupling of the connector 71 of a wire harness 72 while providing an improved receiving capacity for the wire harness 72, etc. Thus, it is possible for the workability to be highly improved, with the other aforementioned advantages being also obtained in the presently filed preferred embodiment.

Also, with a specific arrangement wherein the connector 71 is fixed to the bottom wall 64 of the lower cover 62, the connector joint portion 63 may be readily coupled to the connector 71 during an assembly, with a resultant improved workability.

From the foregoing description given above, it is to be noted that various other modifications may be made without departing the spirit of the present invention. For example, without forming the fuse connector portion 50 at the one terminal 48 which in turn remains in the tab shape, it is possible for the downstream terminal 46 of the fuse 24 to be electrically connected by means of a male-female type junction terminal of a structure in the related art. In such a case, the relay of the present invention may be featured as follows:

(1) The relay is featured in that the one terminal, which corresponds to the downstream terminal of the fuse, is arranged to be located in a different position so as to extend in an orientation different from that in which the other terminals extend.

(2) In the relay (1) defined above, the one terminal is formed with a fuse connector portion which enables the aforementioned downstream terminal of the aforementioned fuse to be directly connected to the aforementioned one terminal.

It will now be appreciated from the foregoing description that in accordance with the present invention, the relay unit features the provision of the plurality of relays each of which has the pair of switch joint circuit bodies between which the relay switch is intervened and the pair of coil joint circuit bodies between which the coil is intervened, with the respective switch joint circuit bodies and the coil joint circuit bodies being electrically connected to one another by means of the relevant joint portions which can be selectively and suitably cut out to provide a desired mounting circuit whereby a variety of circuit patterns can be easily formed with a change in cutting points of the plural joint portions to comply with variations of the mounting circuits in a highly simplified manner. Also, when it is desired to joint the adjacent circuit bodies, there is no need for cutting out the particular joint portion which interconnects the adjacent circuit bodies to one another, it is extremely easy for implementing the joint absorption between the neighboring circuit bodies and also the joint absorption of the wire harnesses.

While specific embodiments of the present invention have been described in detail, it will be appreciated to those skilled in the art that various modifications and alternatives to those details could be developed in light of the overall teachings of the disclosure. Accordingly, the particular arrangements disclosed are meant to be illustrative only and not limiting the scope of the invention which is to be given the full breadth of the following claims and all equivalents thereof.

What is claimed is:

1. A relay unit comprising:
a plurality of relays each including a pair of first and second switch connector circuit components between which a relay switch element is intervened and a pair of first and second coil connector circuit components between which a relay coil element is intervened; and
a plurality of electrically conductive trimmer joint portions preliminarily interconnecting said switch connector circuit components and said coil connector circuit components to one another;
wherein said plurality of electrically conductive trimmer joint portions is enabled to be selectively trimmed to provide a desired mounting circuit formed in a selected relay circuit pattern.

2. The relay unit according to claim 1, wherein:
said plurality of electrically conductive trimmer joint portions include a first trimmer joint portion intervened between said first and second switch connector circuit components in each of said relays and a second trimmer joint portion intervened between one of said pairs of first and second switch connector circuit components and another one of said pairs of first and second switch connector circuit components between adjacent ones of said relays.

3. The relay unit according to claim 1, wherein:
each of said first and second switch connector circuit components and each of said coil circuit components include a switch connector bus bar and a coil connector bus bar, respectively.

4. The relay unit according to claim 3, wherein:
said switch connector bus bar and said coil connector bus bar are partly formed with relay terminals to permit connectors to be coupled thereto, respectively.

5. An electrical junction box comprising:
a relay unit including a plurality of relays each including a pair of first and second switch connector circuit components between which a relay switch element is intervened and a pair of first and second coil connector circuit components between which a relay coil element is intervened, and a plurality of electrically conductive trimmer joint portions interconnecting said first and second switch connector circuit components and said first and second coil connector circuit components to one another, wherein said plurality of electrically conductive trimmer joint portions can be trimmed to provide a desired mounting circuit formed in a selected relay circuit pattern.

* * * * *

UNITED STATES PATENT AND TRADEMARK OFFICE
CERTIFICATE OF CORRECTION

PATENT NO. : 6,914,765 B2
DATED : July 5, 2005
INVENTOR(S) : Tsuyoshi Nakamura et al.

It is certified that error appears in the above-identified patent and that said Letters Patent is hereby corrected as shown below:

<u>Title page,</u>
Item [30], Foreign Application Priority Data, "P2000-39951" should read -- P2000-399551 --.

Signed and Sealed this

Twentieth Day of December, 2005

JON W. DUDAS
*Director of the United States Patent and Trademark Office*